United States Patent [19]

Shoji et al.

[11] Patent Number: 5,475,832
[45] Date of Patent: Dec. 12, 1995

[54] LOGIC SIMULATION METHOD

[75] Inventors: Minoru Shoji; Fumiyasu Hirose, both of Kawasaki, Japan

[73] Assignee: Fujitsu Limited, Kawasaki, Japan

[21] Appl. No.: 233,981

[22] Filed: Apr. 28, 1994

[30] Foreign Application Priority Data

Apr. 28, 1993 [JP] Japan ................................ 5-103056

[51] Int. Cl.$^6$ .................................................. G06F 9/44
[52] U.S. Cl. .................... 395/500; 364/916.3; 364/221.2
[58] Field of Search ............................................. 395/500

[56] References Cited

U.S. PATENT DOCUMENTS

| | | | |
|---|---|---|---|
| 4,656,580 | 4/1987 | Hitchcock | 395/500 |
| 4,787,061 | 11/1988 | Nei | 395/500 |
| 4,787,062 | 11/1988 | Nei | 395/500 |
| 4,819,150 | 4/1989 | Jennings | 395/500 |
| 5,051,941 | 9/1991 | Takamine | 395/500 |

*Primary Examiner*—David Y. Eng
*Attorney, Agent, or Firm*—Staas & Halsey

[57] ABSTRACT

A logic simulation method and apparatus for sequentially performing a high-speed simulation of a logic circuit designed through sequential processing descriptions. An operation control unit corresponds to each of a plurality of operations described in sequential processing descriptions. The operation control unit controls a start of an operation and determines an end of the operation. After determining an end of a first operation by simulating operation of the operation control unit corresponding to the first operation, a next operation described in sequential processing descriptions is simulated concurrently with simulating an operation control unit corresponding to the next operation until all operations have been sequenced through.

11 Claims, 28 Drawing Sheets

FIG. 8A

| | |
|---|---|
| LINE i | OPERATION OF EXPRESSION ① |
| LINE i+1 | OPERATION OF EXPRESSION ② (USING RESULT OF OPERATION OF EXPRESSION ①) |
| LINE i+2 | DETERMINING CONDITION USING RESULT OF OPERATION OF EXPRESSION ② GO TO LINE i+3 IF CONDITION IS SATISFIED. GO TO LINE i+5 IF CONDITION IS NOT SATISFIED. |
| LINE i+3 | OPERATION OF EXPRESSION ③ |
| LINE i+4 | OPERATION OF EXPRESSION ⑤ (USING RESULT OF OPERATION OF EXPRESSION ③) |
| LINE i+5 | OPERATION OF EXPRESSION ④ |
| LINE i+6 | OPERATION OF EXPRESSION ⑤ (USING RESULT OF OPERATION OF EXPRESSION ④) |

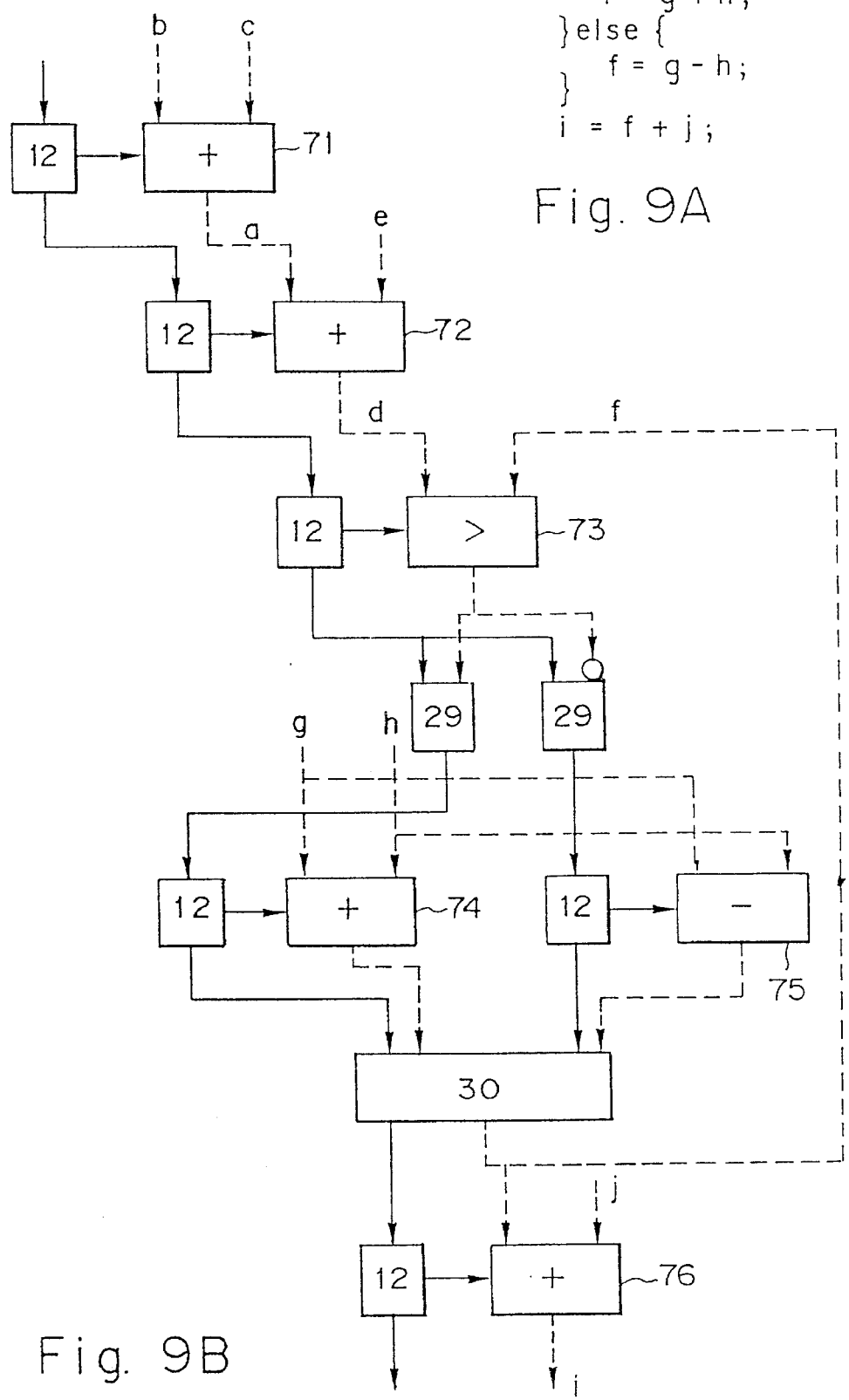

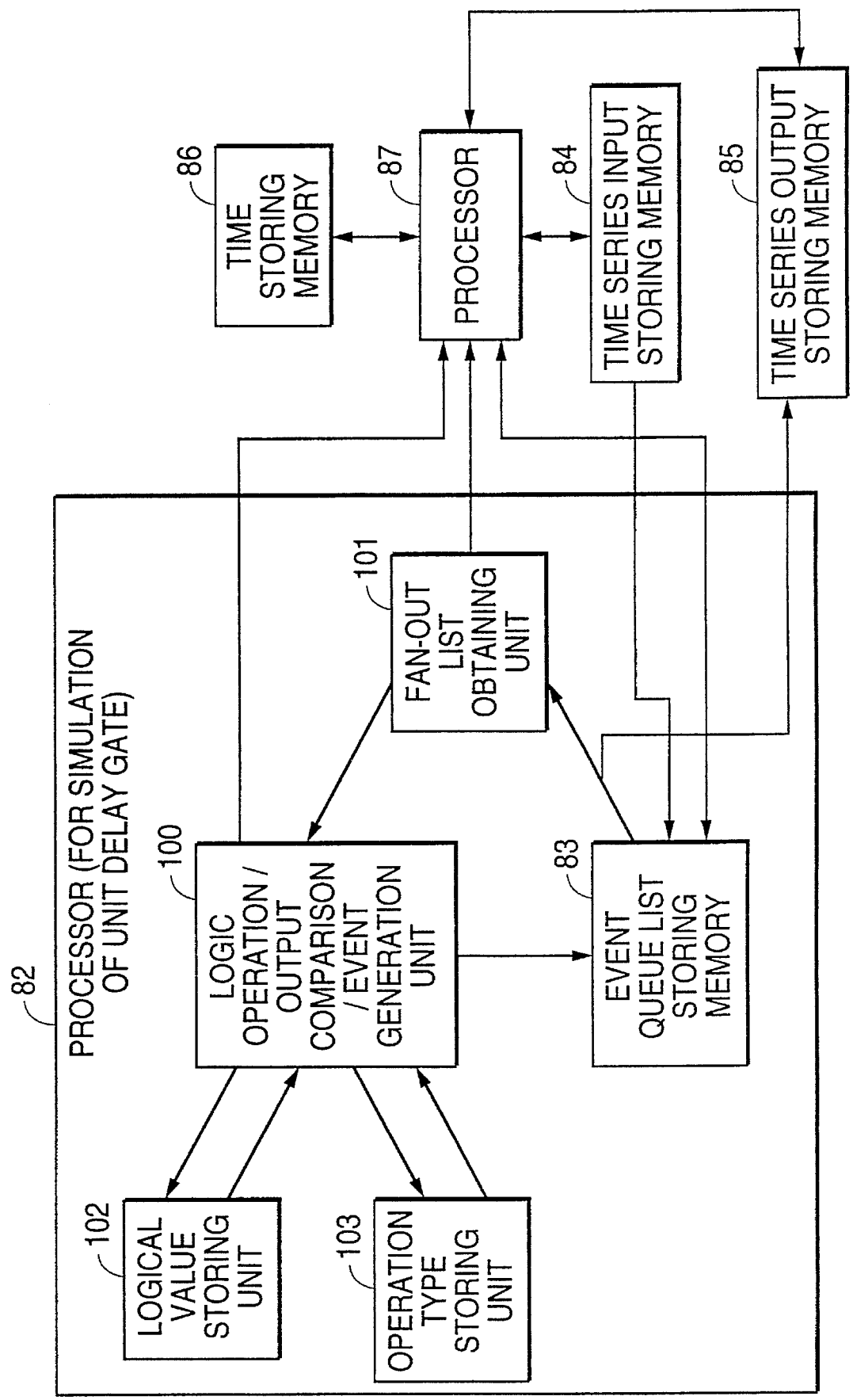

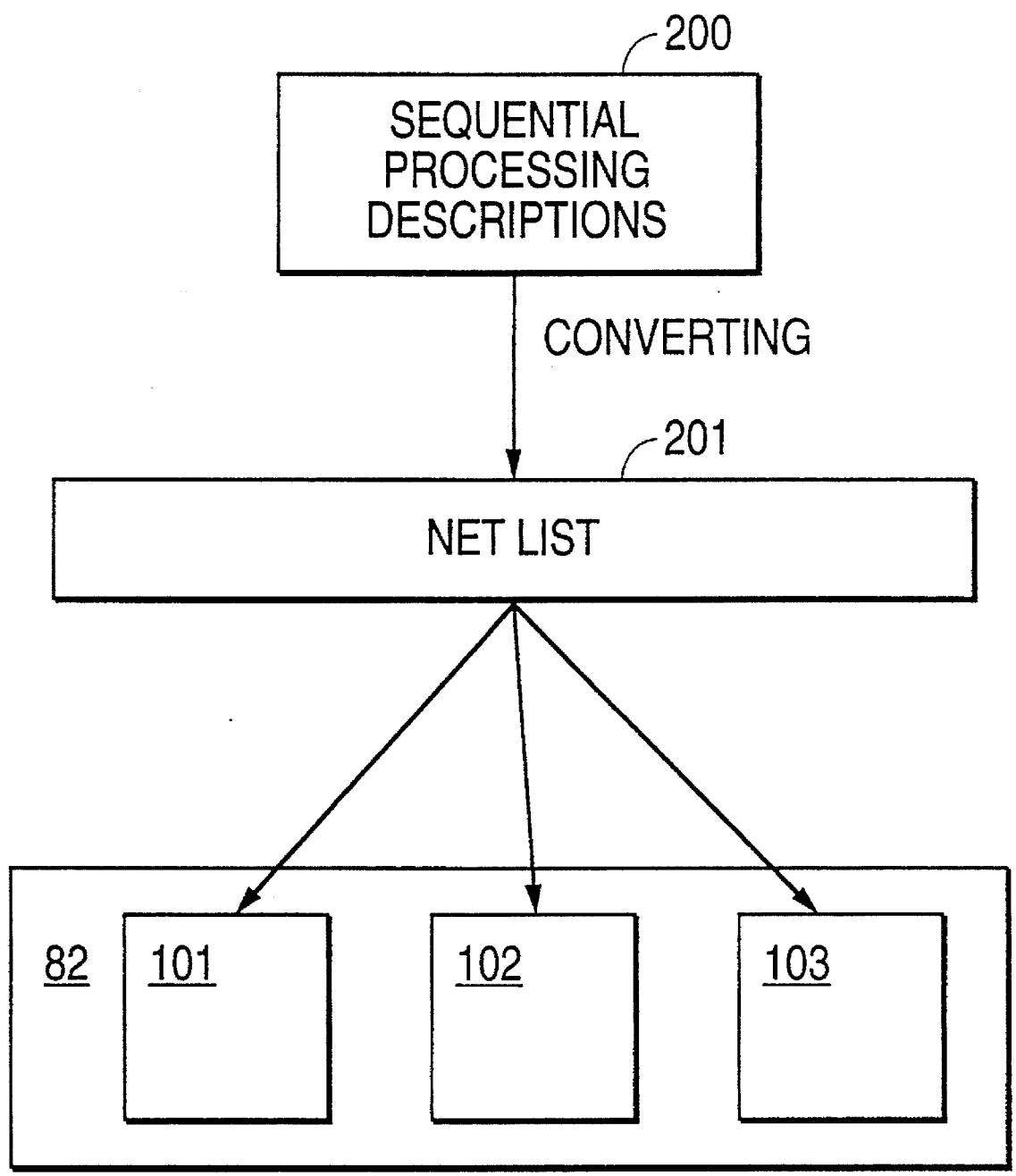

FIG. 14A

```
20 : 20-1, 21-1;
21 : 22-1;
22 : 23-1;
23 : 24-1;
24 : 25-1;
25 : (OUT);
```
101

```
20 : NOT;
21 : BUFFER;
22 : BUFFER;
23 : BUFFER;
24 : BUFFER;
25 : BUFFER;
```
103

FIG. 16A ⌐101

```
26 : 27-2, 26-1;
27 : 28-2, 27-1;
28 : 29-2, 29-4;
29 : 29-1, 29-3, 26-0;
    (OUT);
```

```
26 : NOT;
27 : COUNTER;
28 : COMPARATOR;
29 : 1_DETECT;
```

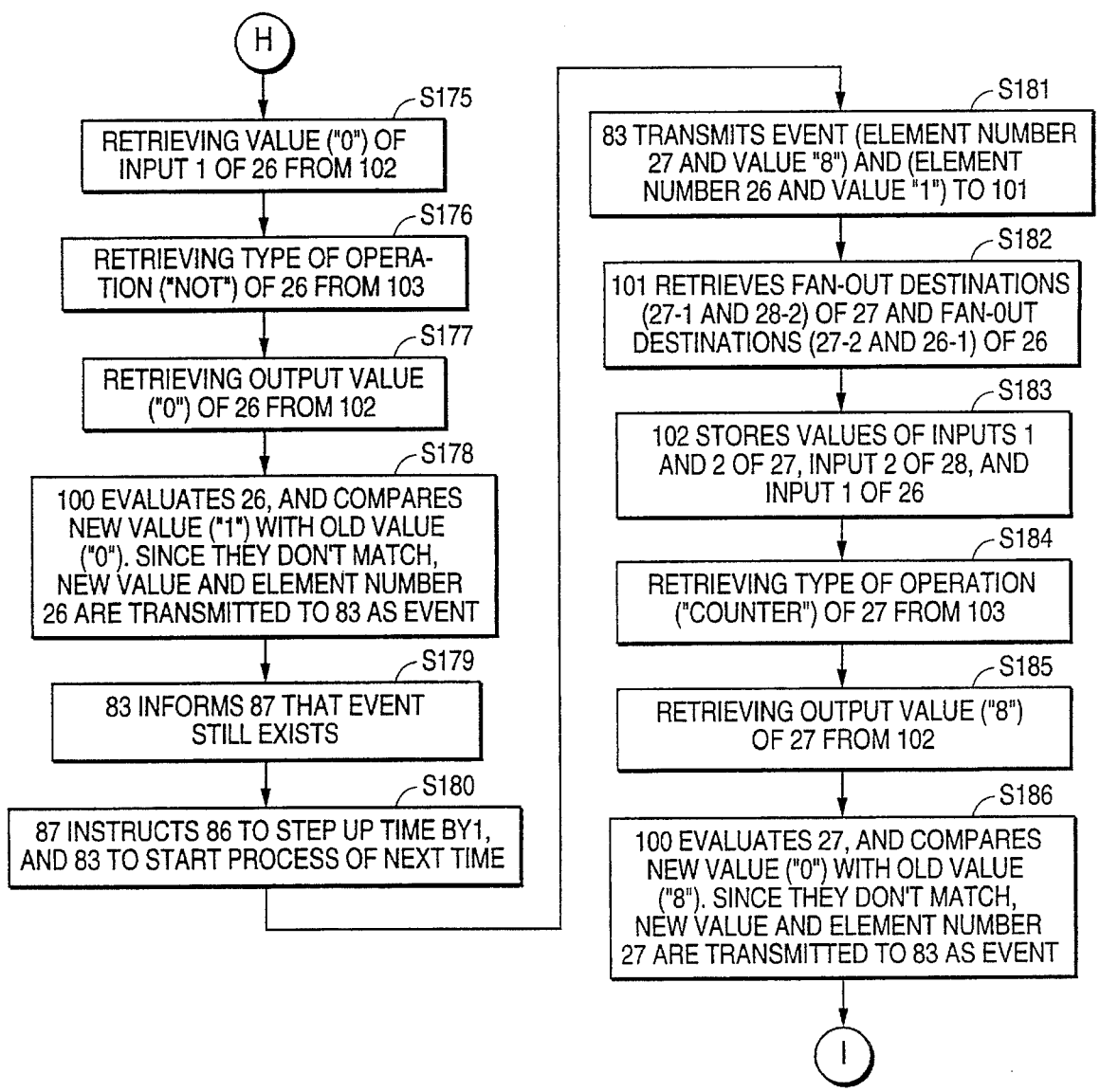

LOGIC SIMULATION METHOD

BACKGROUND OF THE INVENTION

1. Field of the Invention

The present invention relates to a logic simulation method for logically verifying a logic circuit designed through sequential processing descriptions processes.

2. Description of the Related Art

Recently, sequential processing descriptions have been used widely for describing the functions of a logic circuit, input patterns to a logical circuit, etc. in addition to conventional descriptions of a net list of the logical circuit. The time taken for verifying a logic circuit increases corresponding to the expansion in the size of the circuit, and there is a demand on reducing this time.

The time taken for logically verifying a logic circuit which is described by a net list has been shortened by accelerating the execution speed of logic simulation using an exclusive high-speed unit-delay event-driven logic simulator. However, since the exclusive machine can only simulate a net list, the descriptions of the net list must be extracted and simulated or all descriptions must be replaced with a net list through a technology of synthesizing a circuit to perform a logic simulation when a logic circuit designed through a functional description is verified.

In a logic simulation of a logical circuit described based on a function level and designed through sequential processing descriptions, an exclusive simulator cannot be used for shortening the time taken for a logical verification.

SUMMARY OF THE INVENTION

It is an object of the present invention to provide a logic simulator for performing a high-speed simulation of a logical circuit designed through sequential processing descriptions, including a function level, by using a unit-delay event-driven logic simulator.

To attain the above and other objects, a logic simulator for verifying a logical circuit designed through sequential processing descriptions includes an operation control unit, for example, a logic circuit, for controlling the start of an operation, and determining the end of the operation corresponding to each of a plurality of operations to be sequentially processed. With this simulator, the operations to be sequentially processed are carried out from first to last by concurrently performing an operation simulation and a simulation of the corresponding operation control unit.

If it is determined through a simulation of the operation control unit that the corresponding operation has been completed, then the simulation of the next operation to be sequentially processed and the simulation of the corresponding control unit are performed. The process is repeated until all operations are completely processed.

The logic simulation method according to the present invention may be used in a unit-delay event-driven logic simulator. The unit-delay event-driven logic simulator performs a logic simulation in which a unit delay refers to a delay time required to evaluate an output of a single logic element forming a part of a set of logic elements corresponding to each operation described in a sequential process format. In the logic simulator, if it is determined that one of a plurality of operations described in a sequential processing format has been completed by a simulation of the corresponding operation control unit, then the determination result is transmitted as an event to an operation control unit corresponding to the next operation.

As described above, according to the present invention, operations described in a sequential processing format including a function level can be sequentially performed by the order in descriptions.

BRIEF DESCRIPTION OF THE DRAWINGS

One skilled in the art can easily understand additional features and objects of this invention from the description of the preferred embodiments and some of the attached drawings. In the drawings:

FIG. 8A show an example of a program to be processed in a logic simulation;

FIG. 9A shows an example of a function level in descriptions of sequential processing format;

FIG. 9B shows the logic simulation method for the sequential processing descriptions shown in FIG. 9A;

FIG. 10 is a block diagram showing the configuration of an event-driven logic simulator;

FIG. 13 shows a method of storing net list data in the processor;

FIG. 14A shows the data of a fan-out list obtaining unit for FIG. 3B;

FIG. 14B shows the data of a logical value storing unit for FIG. 3B;

FIG. 14C shows the data of an operation type storing unit for FIG. 3B;

Figure 3A:
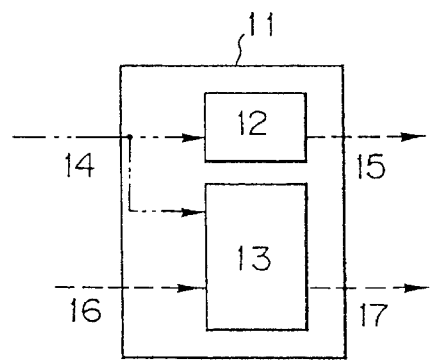
FIG. 3A shows a general configuration of a net list for realizing an arithmetic operation in the sequential processing descriptions.
Figure 3B:
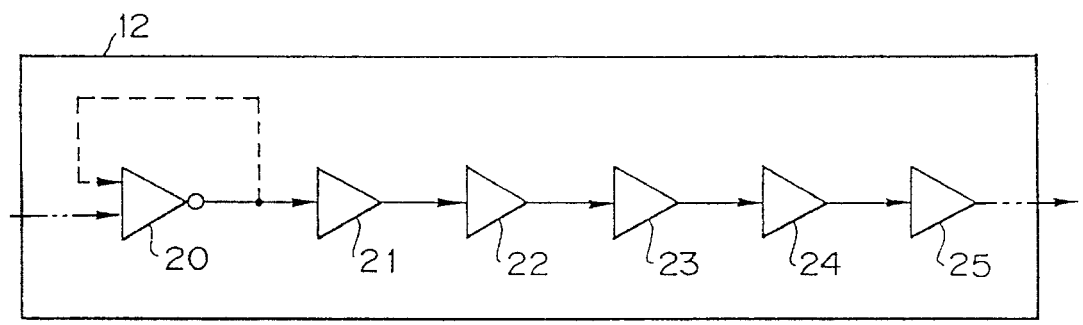
FIG. 3B shows an example of an element set for determining the end of an operation.
Figure 3C:
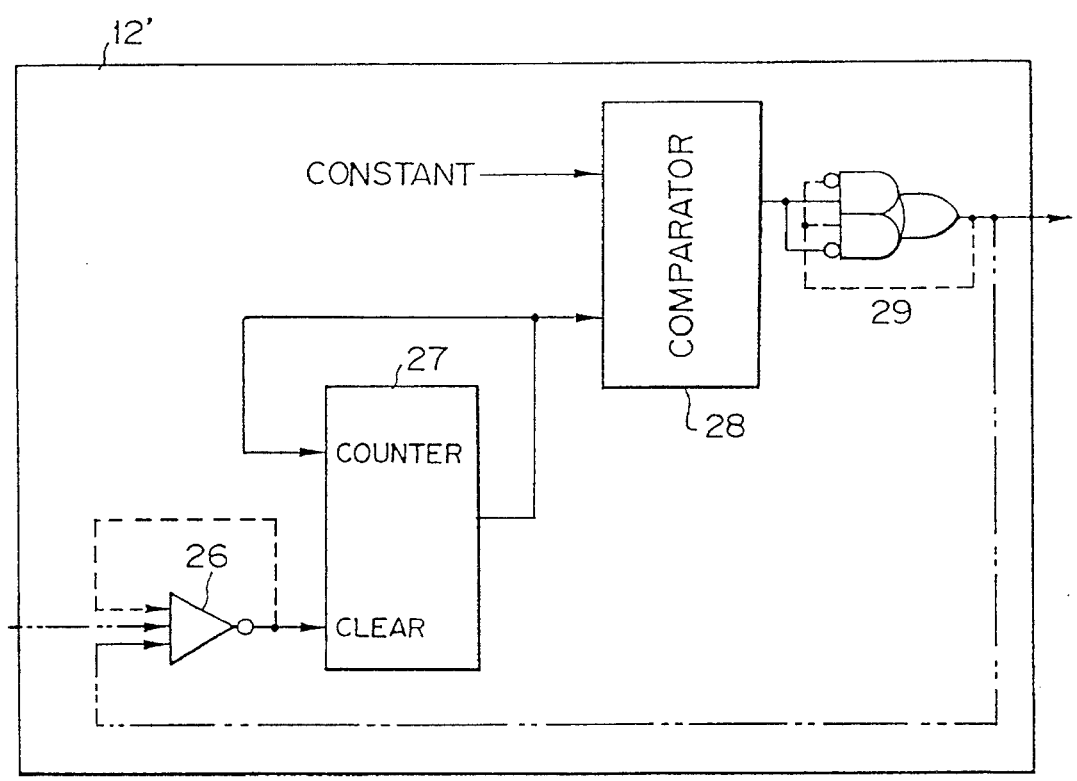
FIG. 3C shows another example of an element set for determining the end of an operation.
Figure 15A:
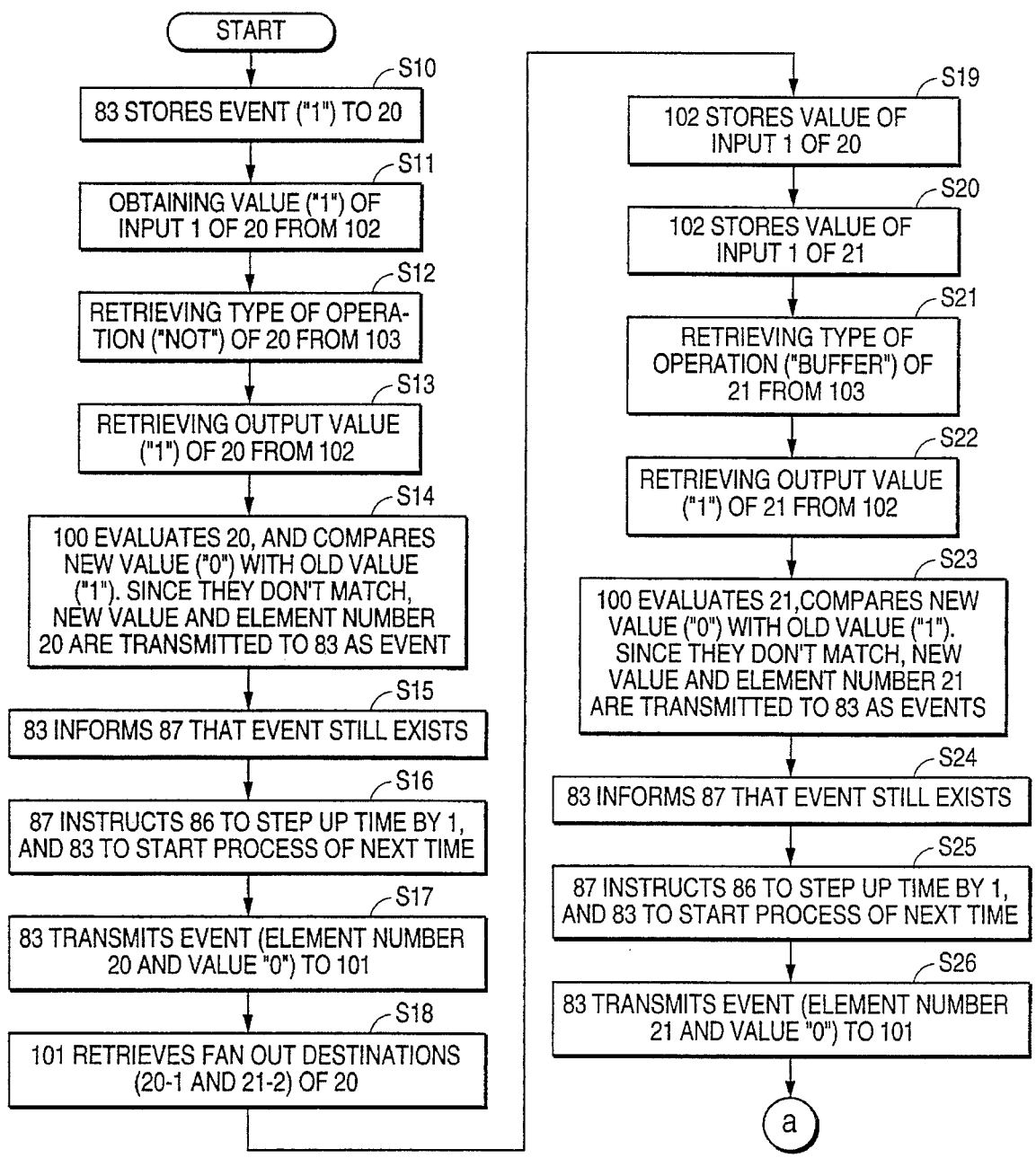
Figure 15B:
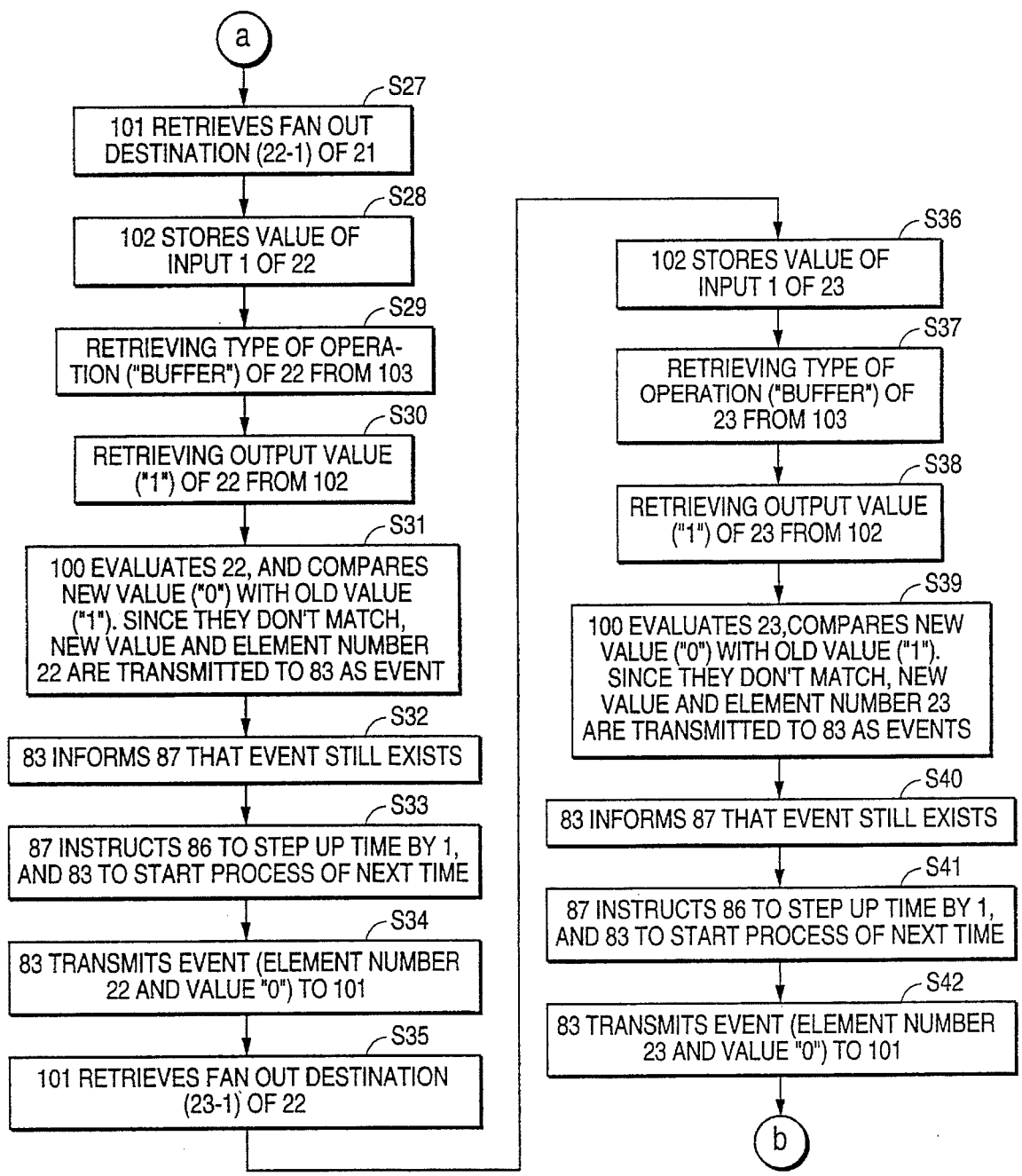
Figure 15C:
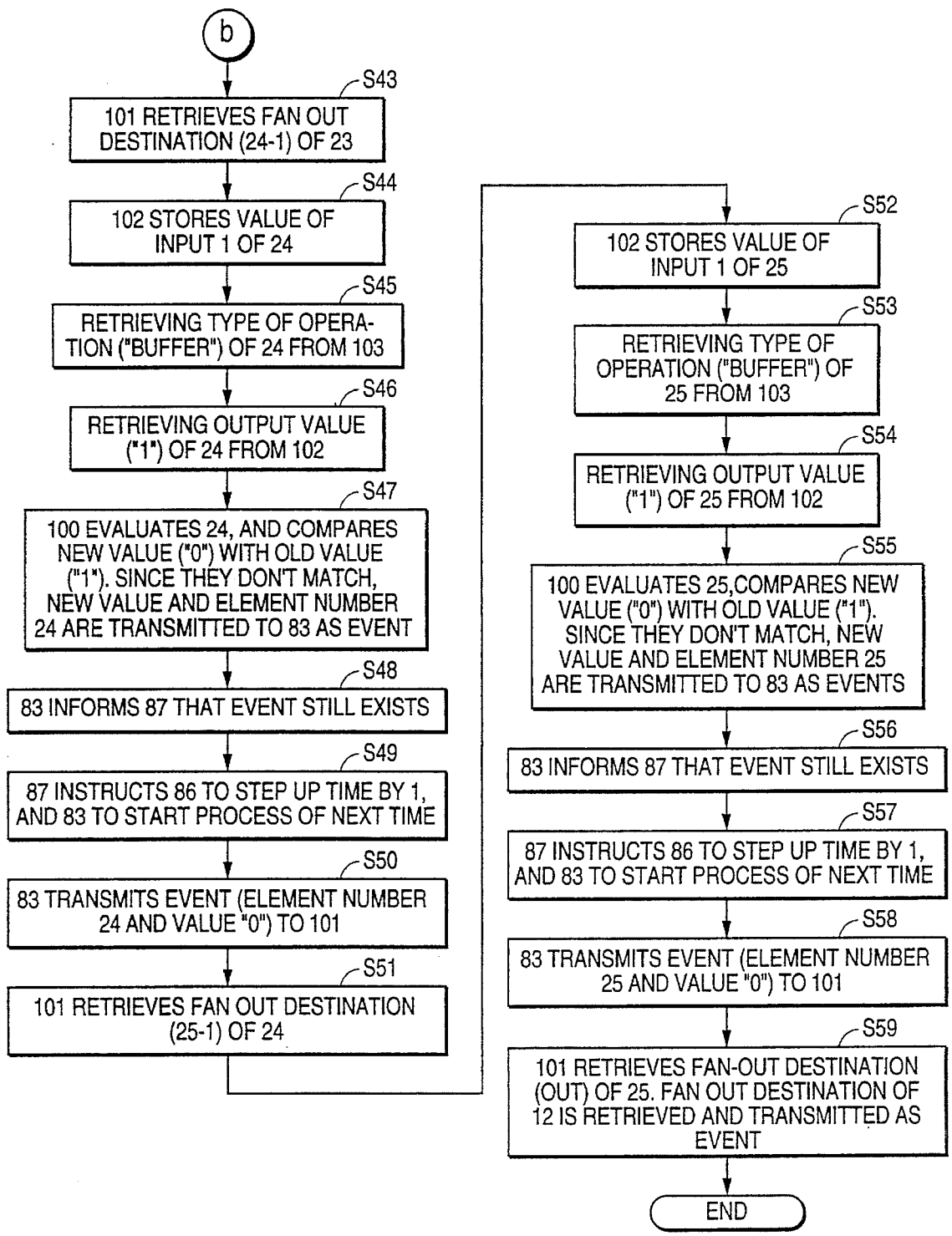
Figure 17A:
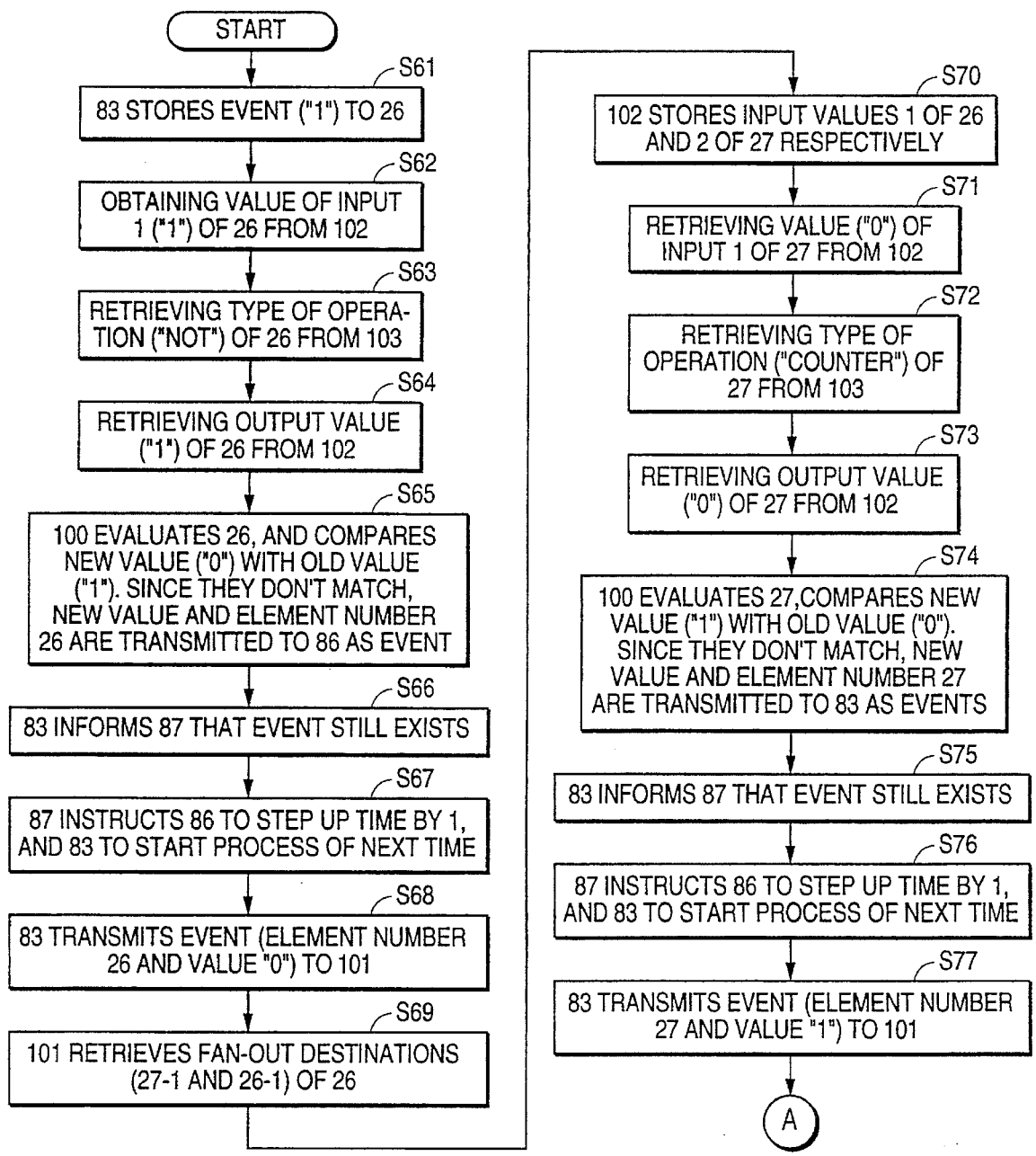
Figure 17B:
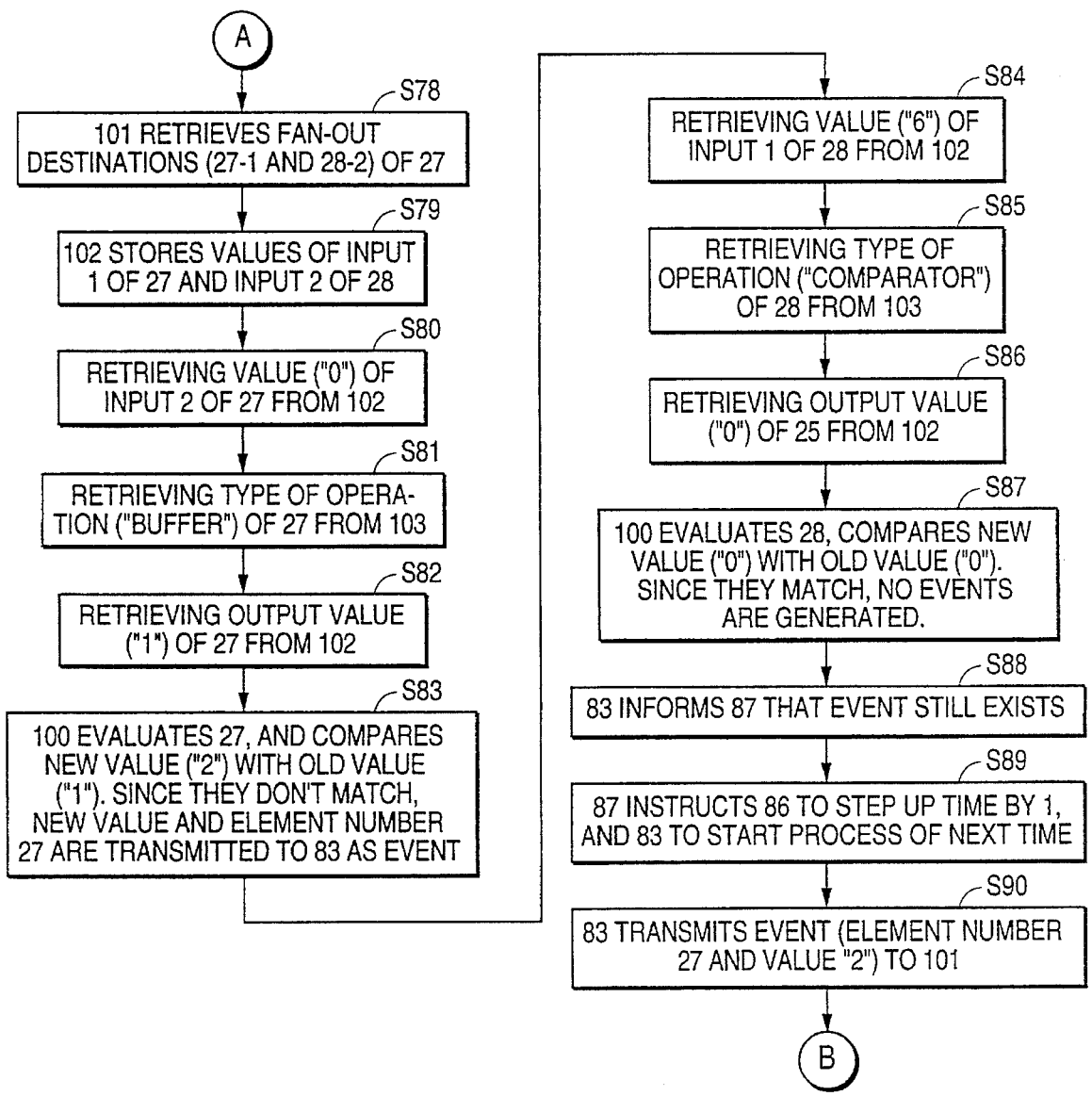
Figure 17C:
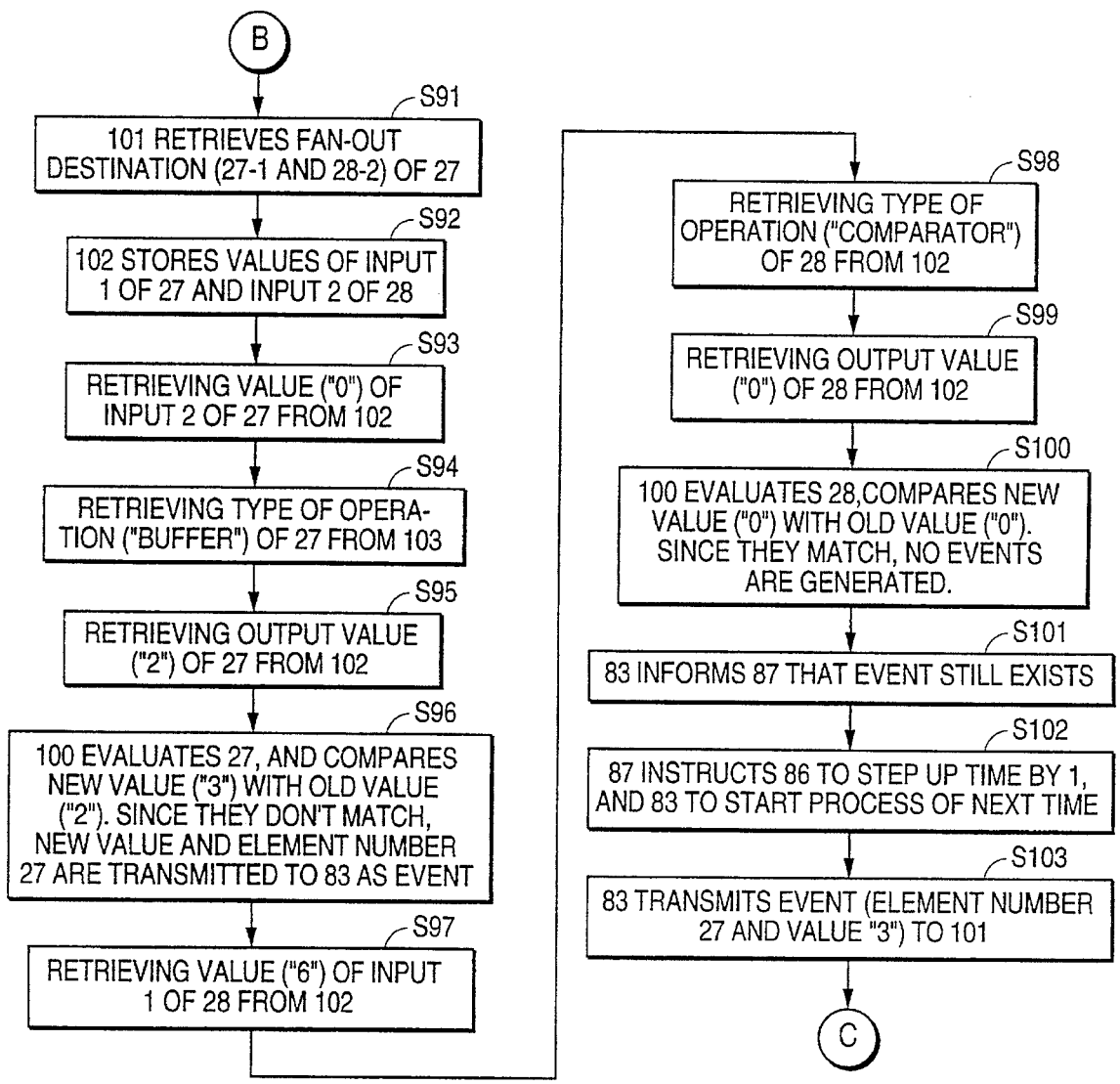
Figure 17D:
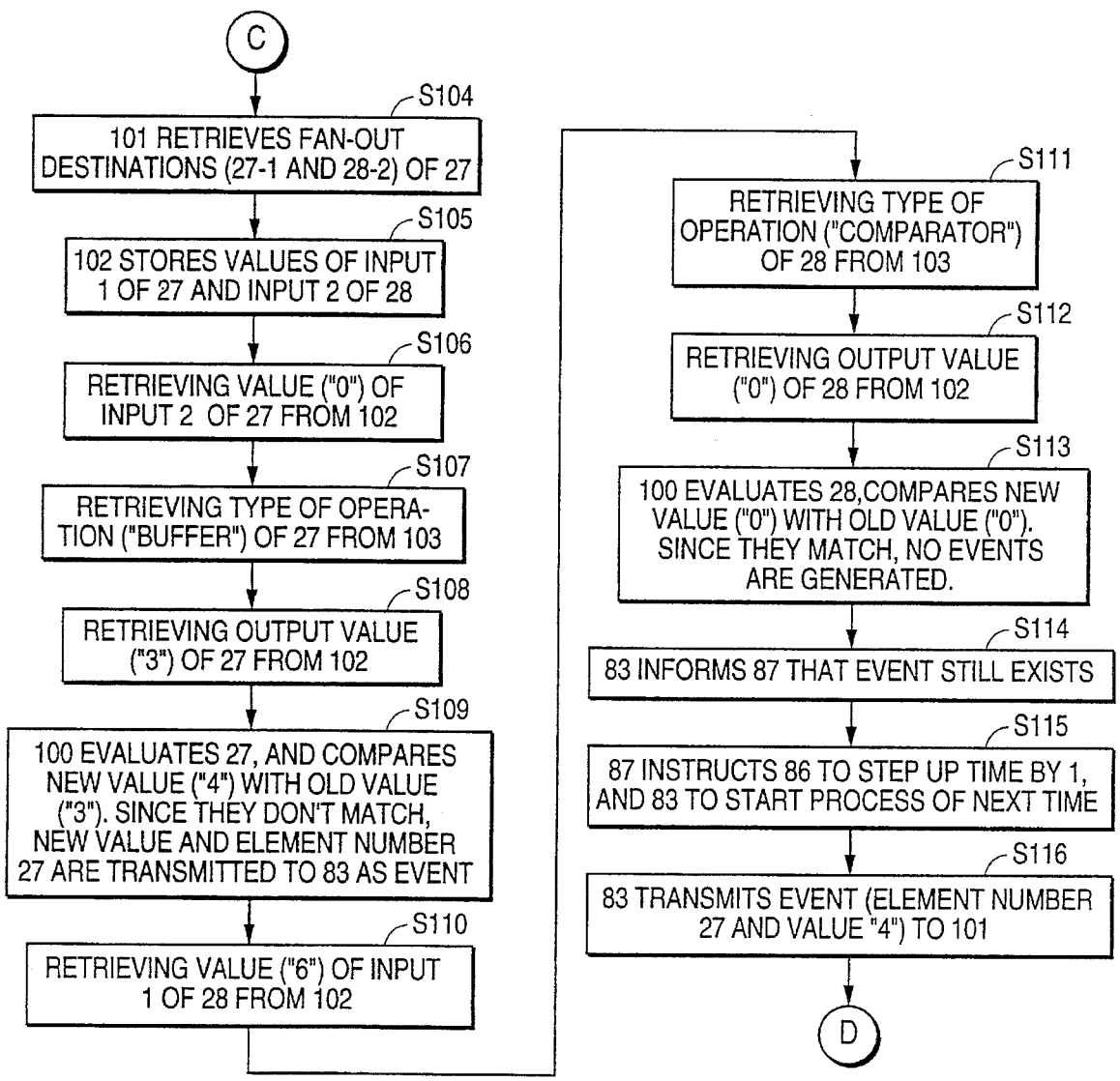
Figure 17E:
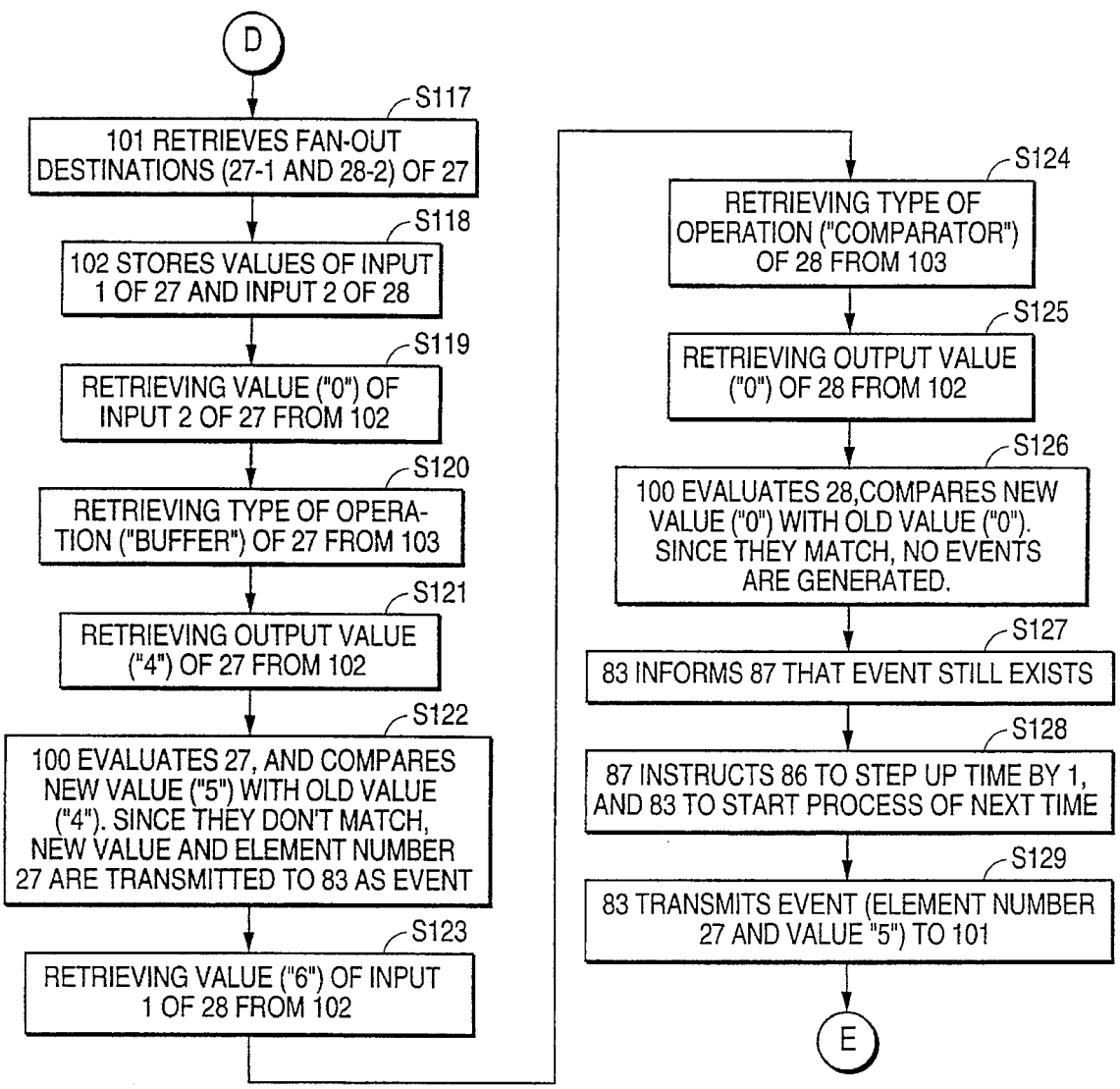
Figure 17F:
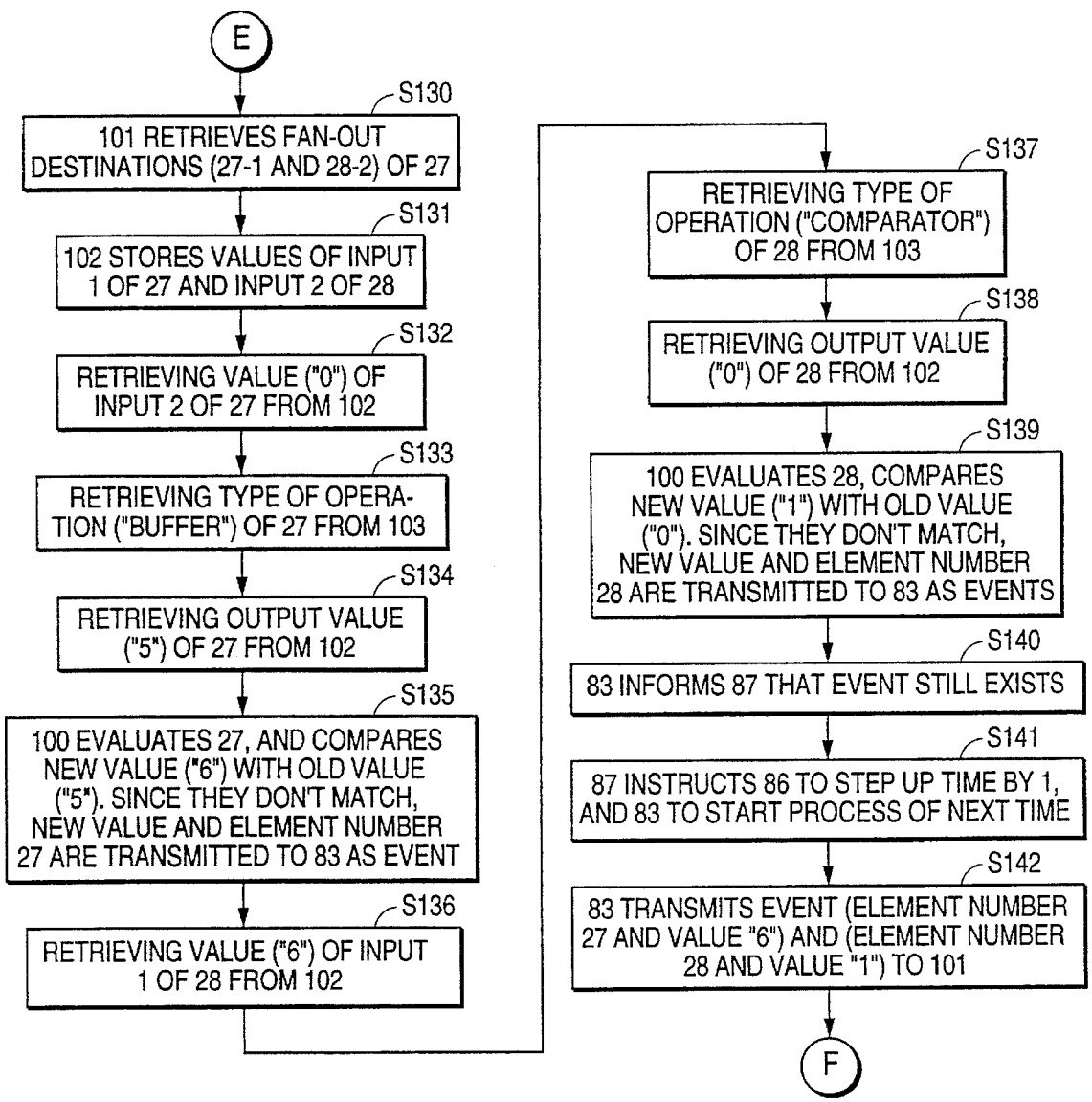
Figure 17G:
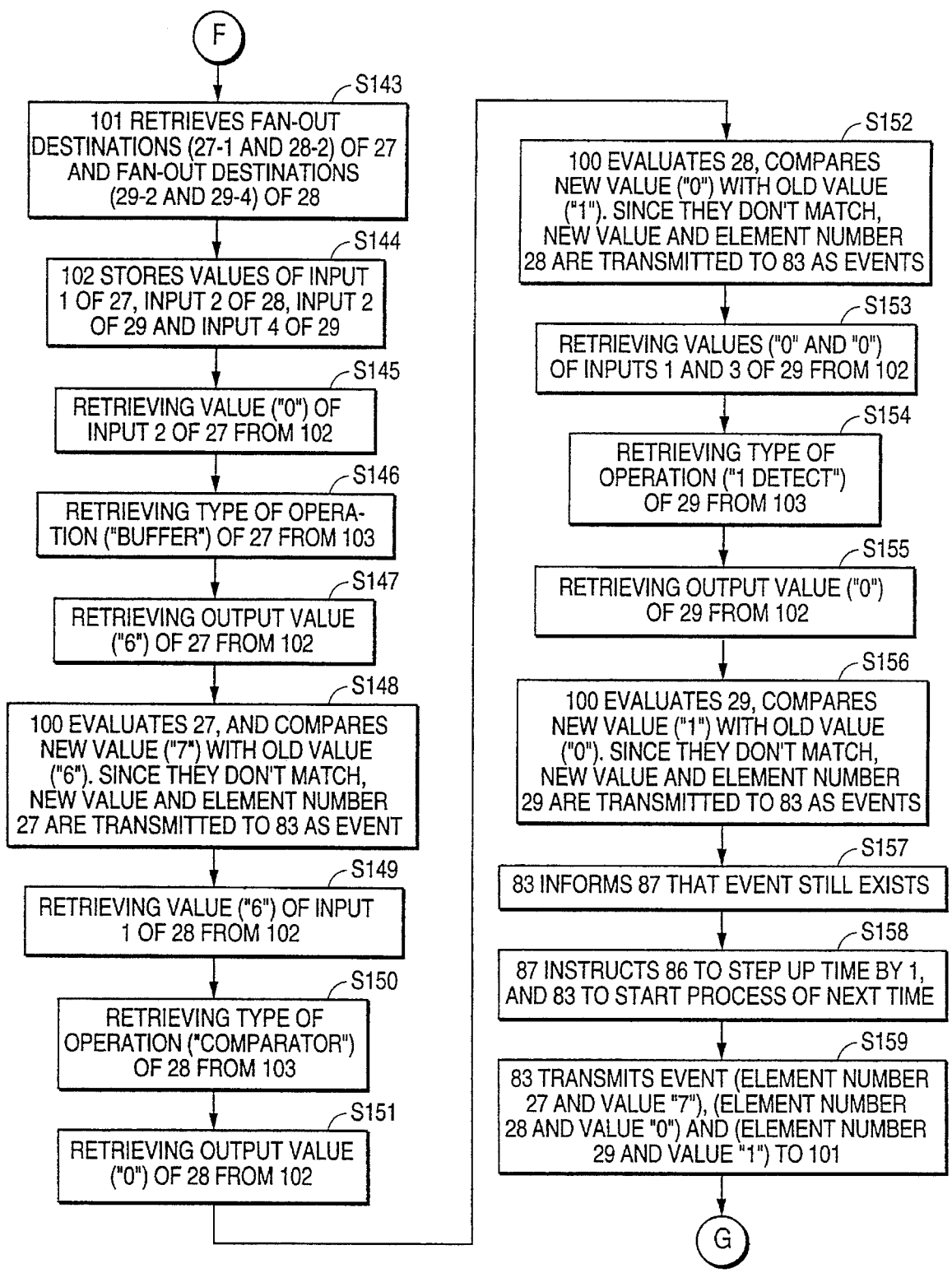
Figure 17H:
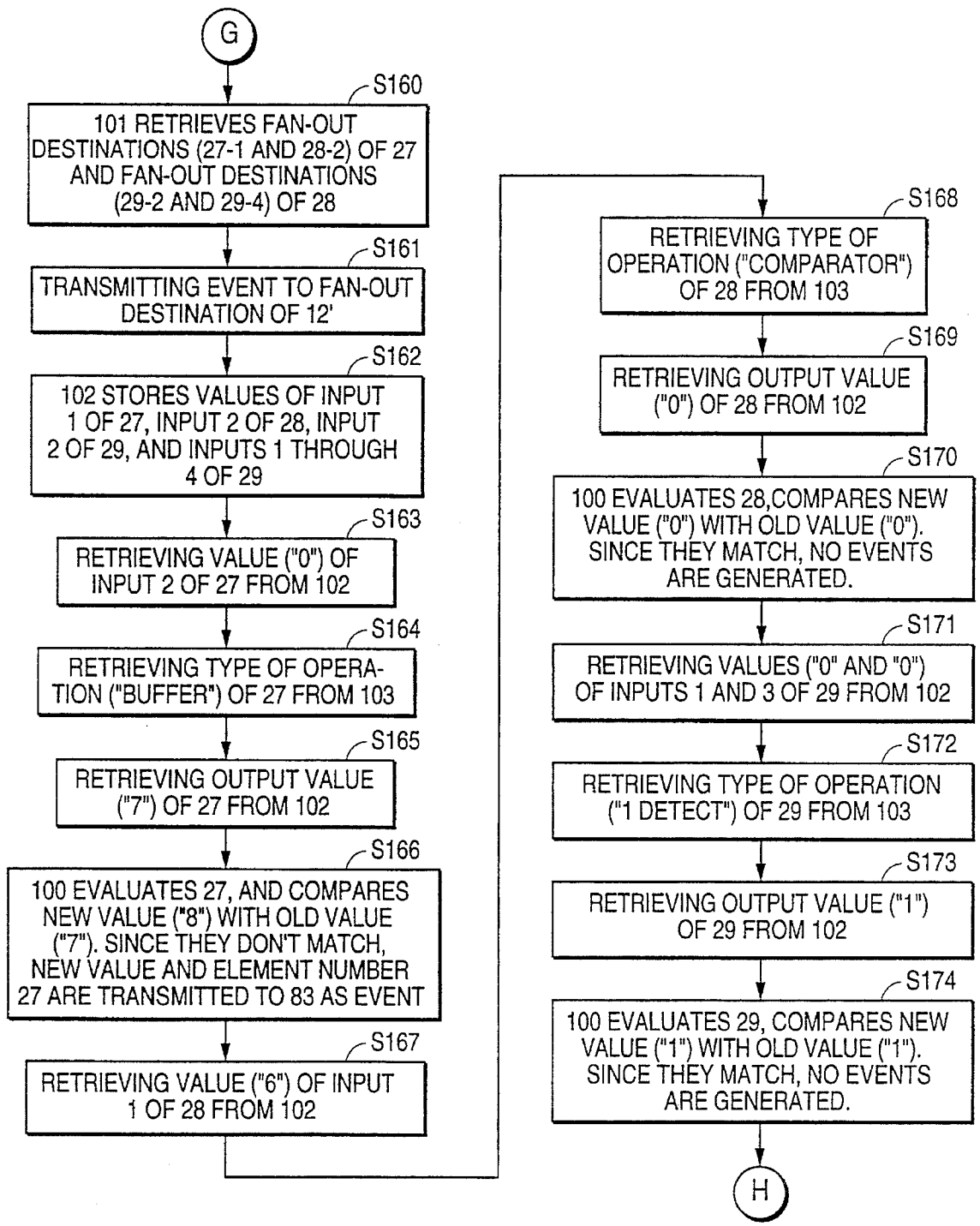

15A is a flowchart (1) showing the simulation for FIG. 3B;

FIG. 15B is a flowchart (2) showing the simulation for FIG. 3B;

FIG. 15C is a flowchart (3) showing the simulation for FIG. 3B;

FIG. 16A shows the data of the fan-out list obtaining unit for FIG. 3C;

FIG. 16B shows the data of the logical value storing unit for FIG. 3C;

FIG. 16C shows the data of the operation type storing unit for FIG. 3C;

FIG. 17A is the flowchart (1) showing the simulation for FIG. 3C;

FIG. 17B is a flowchart (2) showing the simulation for FIG. 3C;

FIG. 17C is a flowchart (3) showing the simulation for FIG. 3C;

FIG. 17D is a flowchart (4) showing the simulation for FIG. 3C;

FIG. 17E is a flowchart (5) showing the simulation for FIG. 3C;

FIG. 17F is a flowchart (6) showing the simulation for FIG. 3C;

FIG. 17G is a flowchart (7) showing the simulation for FIG. 3C;

FIG. 17H is a flowchart (8) showing the simulation for FIG. 3C;

FIG. 17I is a flowchart (9) showing the simulation for FIG. 3C; and

Figure 17J:
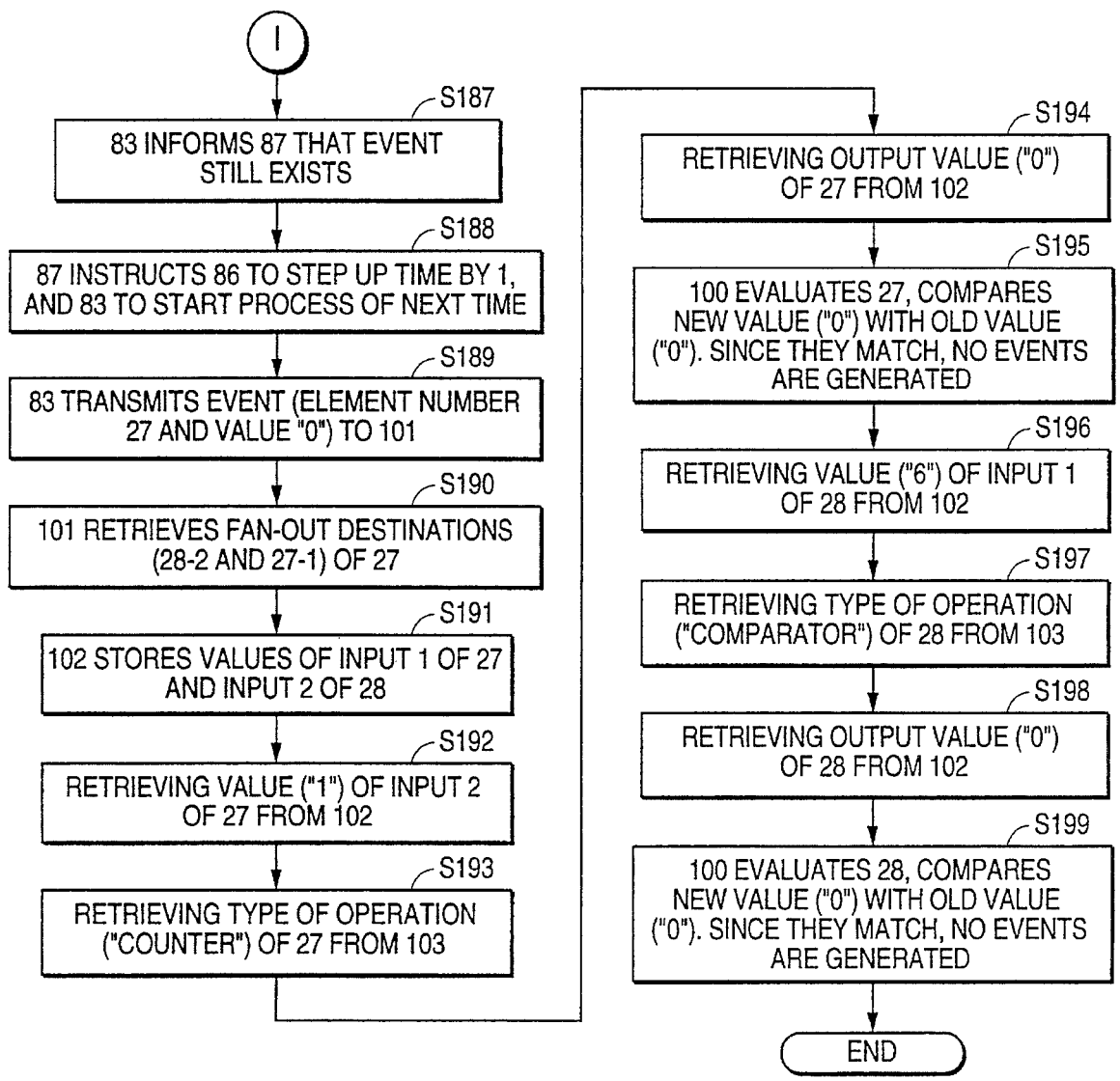

FIG. 17J is a flowchart (10) showing the simulation for FIG. 3C.

DESCRIPTION OF THE PREFERRED EMBODIMENTS

Figure 1:
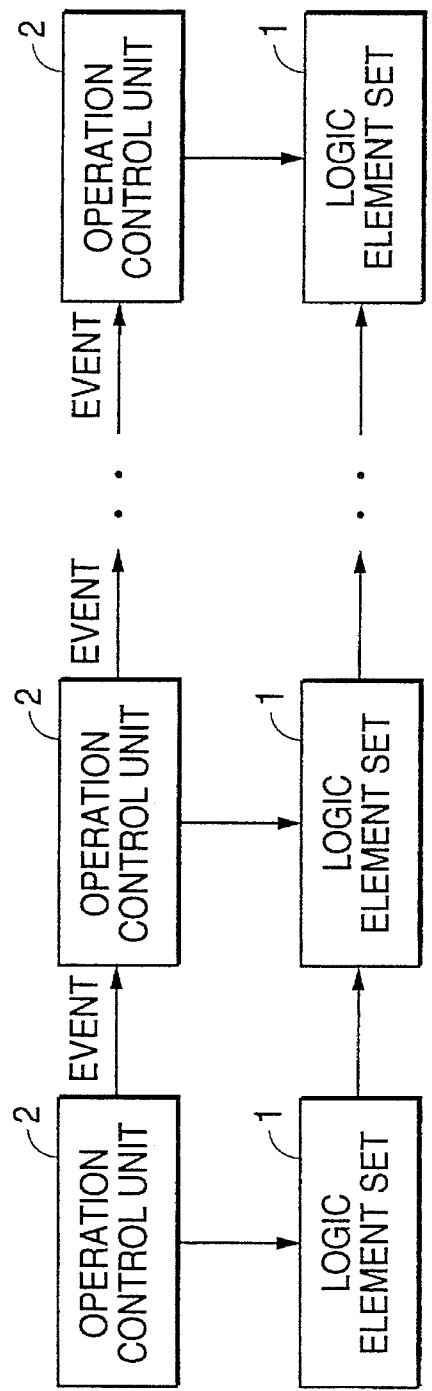
FIG. 1 is a block diagram showing the concept of a logic simulation method according to the present invention.

FIG. 1 shows the concept of the logic simulation method according to the present invention. The logic simulation method is used in verifying a logical circuit designed through sequential processing descriptions.

In FIG. 1, a logic element set 1 is a set of logic elements which are required to perform each of a plurality of operations described in a sequential processing format. A operation simulation is performed by a simulation of the logic element set 1. An operation control unit 2 corresponds to each respective logic element set 1. An end of each operation performed by the corresponding set of logic elements can be determined by the operation simulation of the set of logical element set 1.

After a simulation of the logic element set 1 the corresponding operation control unit 2 determines an end of an operation performed by the set of logic elements 1. An event (output evaluation update event) instructing is output from the operation control unit 2 corresponding to the set of logic elements 1 to perform the next operation in the sequence in the logic simulator, thereby the next operation in the sequence starts.

As described above, according to the present invention, each of the logic elements sets 1 for performing a plurality of respective operations to be sequentially processed corresponds to a respective operation control unit 2. An operation to be performed by the logic element sets 1 at an arbitrary position starts by sending an event to the corresponding operation control unit 2 after completing the simulation of the operation control unit 2 corresponding to the logic element sets 1 for performing a first operation before the present operation. Before sending the event, the process is performed in the logic element set 1 only to update an input value to be processed and entered through an input terminal.

Thus, in the simulation of a logical circuit designed through sequential processing descriptions, an arithmetic operation performed at a certain point in time is limited to one arithmetic operation in the sequential processing descriptions, and the plurality of arithmetic operations sequentially described are performed sequentially in a specified order.

According to the present invention, the operation control unit 2 assumes, for example, a structure formed of a plurality of serially connected event informing elements. Based on the structure, a simulation is performed. The number of serially connected elements in the operation control unit 2 is equal to the number of serially connected logic elements in a path having the maximum number of serially connected elements in the paths from input to output in the logic element set 1 for performing a corresponding operation. If an event indicating the end of an operation of a previous operation control unit 2 is sent to the operation control unit as a result of the simulation of the operation control unit 2 corresponding to the logic element set 1 for performing the previous operation of the present one in the sequence, then the simulation of the operation control unit is started, and it is determined that the operation has been entirely completed when an output of the element in the last stage of the serially connected event informing elements is obtained in the simulation of the operation control unit 2.

The operation control unit 2 may comprise a counter and a comparator. The counter starts count at the start of an arithmetic operation corresponding to the operation control unit 2. The comparator compares a count result of the counter with a set value indicating the total operation time of the elements in a path from input to output, having the maximum number of serially connected elements in the logical element set 1 for performing a corresponding operation. If the count result of the counter has reached the set value in the simulation of the operation control unit then the operation has been completed.

Furthermore, the logic simulation of the present invention is performed by, for example, a unit-delay event-driven logic simulator in which a unit delay indicates a time taken for evaluating an output of a logic element forming part of the set of logic elements 1.

Figure 2:
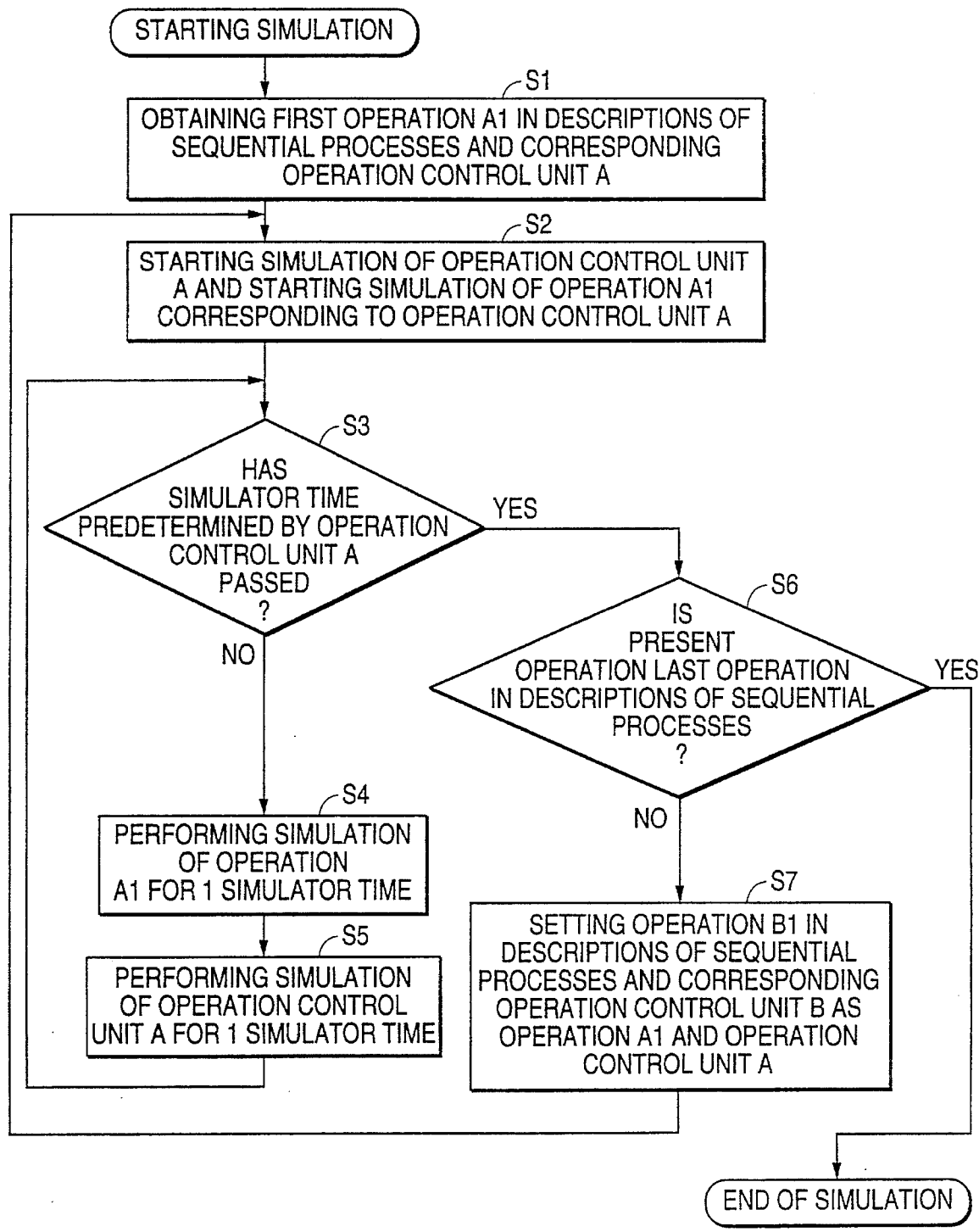
FIG. 2 is the general process flowchart of the logic simulation, according to the present invention.

FIG. 2 is the flowchart showing a process of the logic simulation according to the present invention. In FIG. 2, A1 indicates an operation in sequential processing descriptions, and B1 indicates an operation next in the sequence. A and B are operation control units corresponding to the operations A1 and B1, respectively.

In FIG. 2, after the simulation starts, then the first operation A1 in the sequential processing descriptions and the corresponding operation control unit A are obtained in step S1. In step S2, the simulation of operation control unit A and the simulation of operation A1 corresponding to operation control unit A is started. In step S3, it is determined whether or not a predetermined simulation time, set in the operation control unit A, has passed.

If the predetermined simulation time has not passed yet, the simulation of operation A1 is performed for 1 simulator time in step S4. In step S5, the simulation of operation control unit A is performed for 1 simulator time, and thereafter the processes in step S3 through step S5 are repeatedly performed until the simulation time has passed.

If it is determined in step S3 that a predetermined simulation time has passed, then it is determined in step S6 whether or not the operation being performed is the last operation in the sequential processing descriptions. If not, the next operation B1 in the sequential processing descriptions and the corresponding operation control unit B are set as operation A1 and operation control unit A, respectively in step S7. Then, the processes in step S2 through step S5 are performed as described, and the simulation terminates if it is determined in step S6 that the operation being performed is the last operation in the sequential processing descriptions.

As described above, an operation control unit and an element set to be processed in a logic simulation are not actually incorporated into a logic circuit. However, for convenience in the following explanation, an operation control unit comprises a net list, and an event transmitted in a logic simulator is transmitted between operation control units.

FIGS. 3A through 3C show the method of performing each operation in sequential processing descriptions using a net list. In FIG. 3A, partial circuit 11 corresponds to an operation in sequential processing descriptions; an element set 12 determines an end of an operation, and corresponds to the operation control unit 2 shown in FIG. 1; and an element set 13 realizes one operation in the sequential processing descriptions and corresponds to the set of logic elements 1 shown in FIG. 1. The feature of the logic simulation of the present invention resides in that the simulations of partial circuits 12 and 13 are performed concurrently.

As for the variations of lines in FIGS. 3A through 3C, a solid line indicates an event for informing of update of an input value and update of evaluation of an output value; a broken line indicates an event for informing of update of an input value; and an alternate long and two short dashes line indicates an event for informing of update of evaluation of an output value only. An event input terminal 14 instructs the partial circuits to perform an operation. An event output terminal 15 instructs other partial circuits to perform an operation. A value-to-be-processed input terminal 16 is used to enter a value to be processed which is required by element set 13 for performing an operation. An output terminal 17 outputs a result of an operation performed by element set 13.

FIG. 3B shows an example of element set 12 for determining an end of an operation. In FIG. 3B, an end of an operation performed by element set 13 for realizing a corresponding operation is determined using a plurality of serially connected event informing elements. The number of these event informing elements is equal to the maximum number of serially connected elements in a path among the paths from input to output in element set 13 for performing a corresponding operation.

In FIG. 3B, element set 12 for determining an end of an operation comprises an inverter 20 and five buffers 21 through 25. In the two input lines connected to the inverter 20, the alternate long and two short dashes line indicates a path to which an event instructing to perform an operation outputted by element set 12 for determining the end of the previous operation of the present operation in the sequence, that is, an event indicating evaluation update of an output value, is entered. The broken line connected from the output terminal of the inverter 20 to its input terminal indicates that the present output value is entered as a new input value. If an output evaluation update event, that is, an input of an alternating long and two short dashes line, is provided for the inverter 20, then a new output value is a value obtained by inverting the present output value of the inverter 20. Then, an input is updated so that the new output value can be the input value of the inverter 20. That is, the inverter 20 inverts an output value each time it receives an output evaluation update event, resulting in an output of an event to buffer 21.

Buffers 21 through 25 output input results as is. However, the delay time of each operation of the buffers 21 through 25 and the inverter 20 is equal to the operational delay time of one element in element set 13 for performing arithmetic operations, whereas the entire delay time from informing the inverter 20 of an output evaluation update event to outputting an output evaluation update event, from the buffer to the next partial circuit 11, that is, 15, is equal to the time taken for performing an operation performed by element set 13. Element set 12 for determining the end of an operation determines the end of the operation performed by the corresponding element set 13 for performing operations through the simulation. In this example, a similar operation can be performed by replacing all buffers 21 through 25 with inverters.

A practical example of element set 13 for performing a logic operation corresponding to element set 12 for determining an end of operation shown in FIG. 3B is not described above.

FIG. 3C shows another example of element set 12 for determining an end of an operation. In FIG. 3C, element set 12 for determining an end of an operation comprises an inverter 26, a counter 27, a comparator 28, and element set 29 which inverts an output value on receiving an output evaluation update event when an input value is "1" as explained below in FIGS. 4A and 4B.

The inverter 26 inverts an output value, as in the case of the inverter 20, each time it receives an output evaluation update event indicated by an alternate long and two short dashes line. The initial value of an output value is "1", and changes to "0" when an output evaluation update event is sent by the input terminal 14 shown in FIG. 3A.

Thus, the counter 27 starts to count, and its output is compared with a predetermined constant, by the comparator 28. For example, the constant indicates a delay time corresponding to the number of event informing elements in FIG. 3B. When an output of the counter 27 has reached the constant, the comparator 28 outputs "1". Then, an output value of element set 29 is inverted from "0" to "1" upon receipt of an output evaluation update event as explained by referring to FIG. 4B, and the result is outputted to another partial circuit as an output evaluation update event, that is, an instruction to start an operation. The result is also sent to the inverter 26, thus stopping the counting operation of the counter 27. In this example, the counter 27 can be a down counter for counting down from a predetermined constant. In this case, the comparator 28 compares an output of the counter with "0".

The operation of the counter shown in FIG. 3C is explained below in detail. As described above, the initial value of the inverter 26 (a value provided for the input pin) is "1", and an output value is also "1". If entered is an output evaluation update event, represented by an alternate long and two short dashes line reaching the inverter 26 from the left in FIG. 3C, the output is inverted to "0" from the input value "1". At this time, only an input update event (represented by a broken line from the output of the inverter 26 to the input line) is provided, thereby applying a value of "0" to the input pin. However, the evaluation of an output based on the new input value does not start yet.

When "0" is outputted by the inverter 26 to a clear terminal of the counter 27, the counter starts to count. If an output value of the counter has reached a predetermined constant, then the comparator 28 sends an event of "1" to element set 29 as an output value. The output of the set 29 turns from "0" to "1", and the change information is given to the input line of element set 29 and to the inverter 26 as an event. The inverter 26 is given an event informing of evaluation update of an output value. When the event is entered, the output of the inverter is evaluated and updated. That is, the output in response to the above-mentioned input value "0" is evaluated, and the inverter 26 outputs "1" as a result. Since the output value "1" clears the counter 27 and its output is constantly "0", a new event is not generated afterward.

Thus, the above-mentioned broken line, that is, an event informing of only update of an input value, indicates that when an output value of the inverter 26 changes, the succeeding value after the change is an input value to the inverter 26. The event singly does not cause evaluation of an output value in response to the new input value. On the other hand, an alternate long and two short dashes line, that is, an event informing of evaluation update of an output value causes evaluation of an output of a logic element whose new input value is set but output value not evaluated, according to its input value.

Figure 4A:
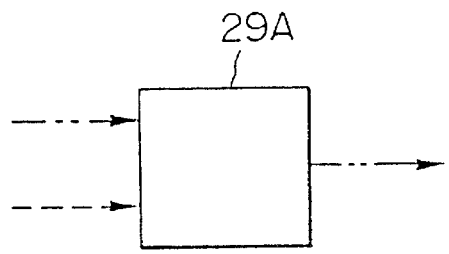
FIG. 4A is a block diagram showing the net list for use in realizing a conditional branch.

FIGS. 4A through 4D show the net list for realizing a conditional branch. In FIG. 4A, element set 29A outputs an output evaluation update event only when an input value is "1". A conditional branch in sequential processing descriptions is realized by adding element set 29A before a partial circuit for performing an operation corresponding to each condition. Since the element set 29A transmits an event instructing a partial circuit to perform an arithmetic operation only when a conditional expression provides "1" for the circuit, only the corresponding partial circuit receives the event and no other partial circuits receive it, thereby preventing other operations from being performed.

Figure 4B:
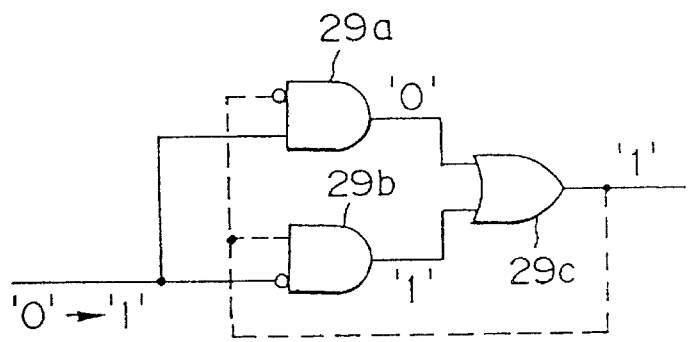
FIG. 4B shows an operation (1) of a net list for use in a conditional branch.
Figure 4C:
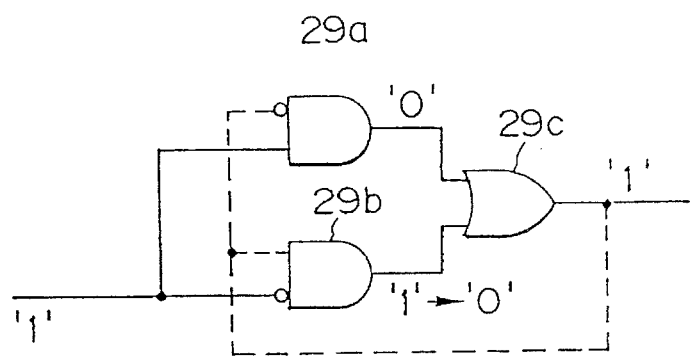
FIG. 4 shows an operation (2) of a net list for use in a conditional branch.
FIG. 4D shows an operation (3) of a net list for use in a conditional branch.
Figure 4D:
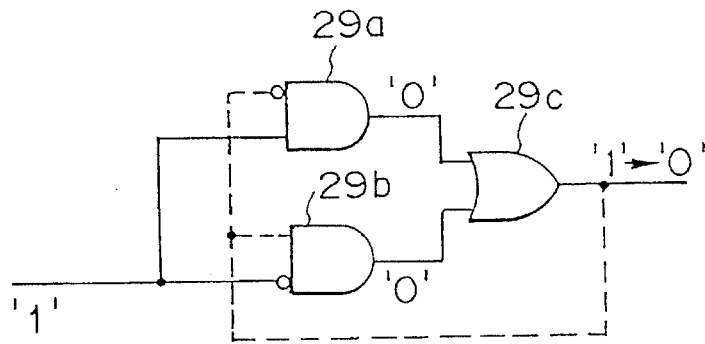

FIGS. 4B through 4D show the operation of a net list of a conditional branch. An embodiment of a net list is the same as element set 29 described by referring to FIG. 3C. In the net list, the two sets of elements 12 and 13 explained by referring to FIG. 3A are not clearly distinguished from each other.

In FIG. 4B, an input value applied to AND circuits 29a and 29b changes from "0" to "1" according to an input update event, and simultaneously or afterwards, an output evaluation update event is transmitted. In FIG. 4B, only an input value changes from "0" to "1", and outputs of AND circuits 29a, 29b, and 29c remain unchanged, and the initial value of an output of OR circuit 29c is "1".

In FIG. 4C, the evaluation of outputs of AND circuits 29a and 29b is updated, and the output of 29b changes from "1" to "0". In FIG. 4D, the evaluation of an output of OR circuit 29c is updated, and the output changes from "1" to "0", thereby finally outputting an event.

If the initial value is "0" instead of "1" for an output of OR circuit 29c, then the output of OR circuit 29c finally changes from "0" to "1", thereby outputting an event. That is, with element set 29, the output of OR circuit 29c is necessarily inverted and an event is outputted if an output evaluation update event is transmitted when the input value is "1".

Figure 5B:
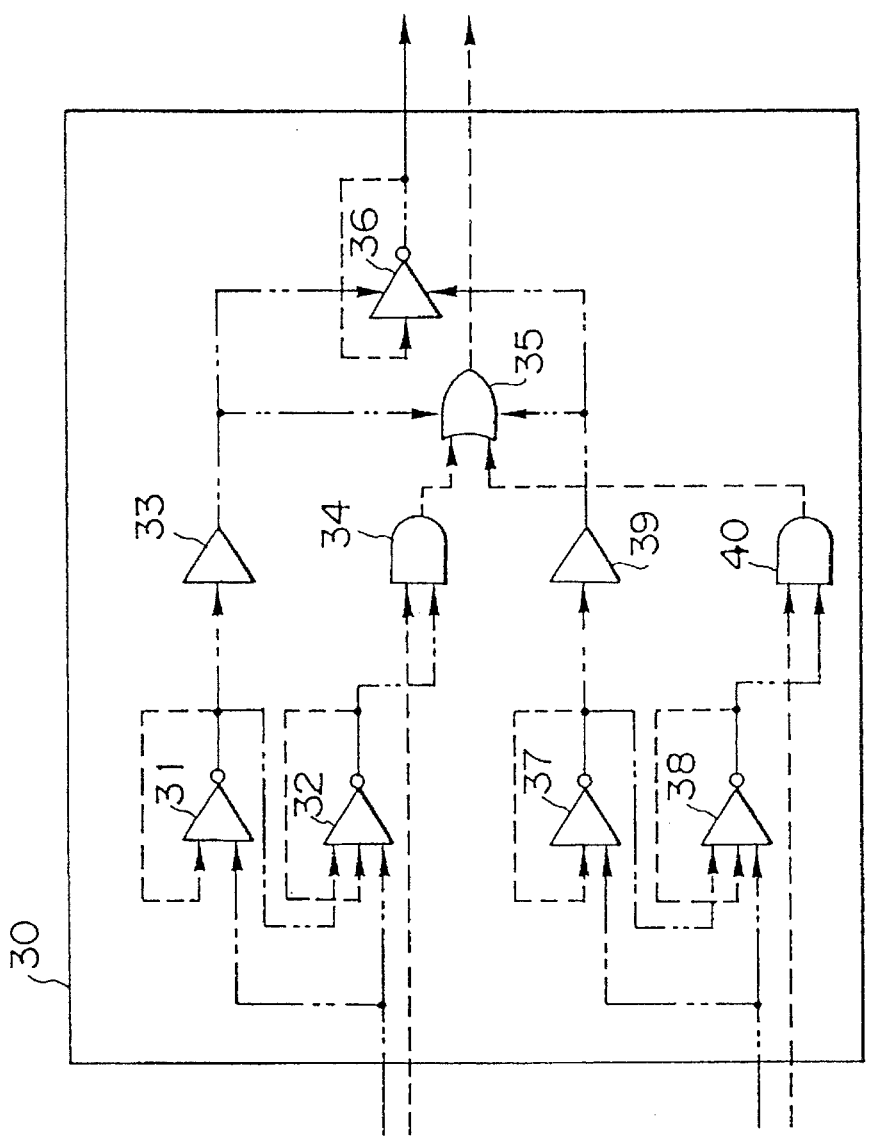
FIG. 5B shows an example of the internal configuration of the block shown in FIG. 5A.
Figure 5A:
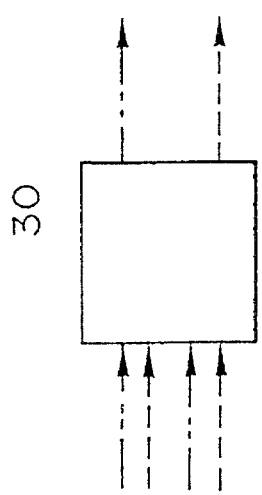
FIG. 5A is a block diagram of an element set for outputting a single value corresponding to one of a plurality of input values.

FIGS. 5A and 5B show an element set for outputting a single value corresponding to one of a plurality of input values. Element set 30 shown in FIG. 5A selects, from plural pieces of data inputted according to an input update event, only a piece for which an event is entered to an input terminal of an output update event, and provides a corresponding output. If a net list is designed to receive events from all partial circuits for providing inputs, then an event from only one of the partial circuits can be made to receive an event and to perform processing. With element set 30, the sets of elements 12 and 13 shown in FIG. 3A cannot be clearly distinguished from each other, either.

FIG. 5B shows a practical example of the element set shown in FIG. 5A. In FIG. 5B, inverters 31 and 32 invert their outputs each time they receive an output evaluation update event. The initial value of an output of inverter 32 is "0", and changes to an output of "1" if an output evaluation update event is applied to the input terminal of the inverter. As a result, AND circuit 34 outputs a value predetermined according to an input update event, to OR circuit 35 as a new output value. OR circuit 35 outputs the output value of AND circuit 34 according to an output evaluation update event from buffer 33. Simultaneously, inverter 36 inverts the output, and outputs a resultant event as an output evaluation update event. That is, if an output of AND circuit 34 has changed, then the new value is transmitted to OR circuit 35 and the output value of OR circuit 35 is updated according to an output evaluation update event from buffer 33.

Figure 6:
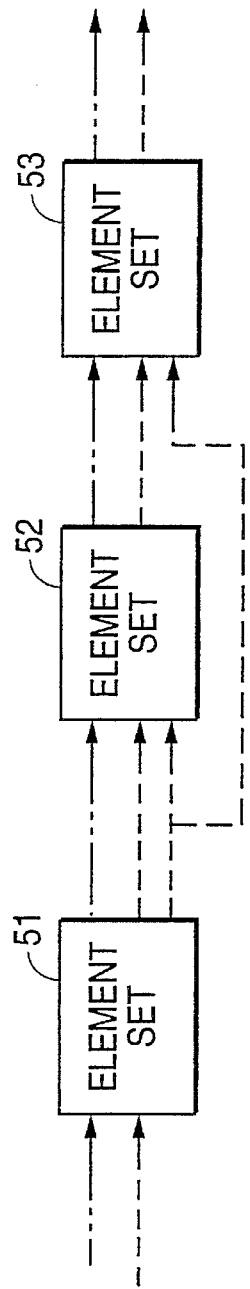
FIG. 6 shows an example of connection of each element set (1)
Figure 7:
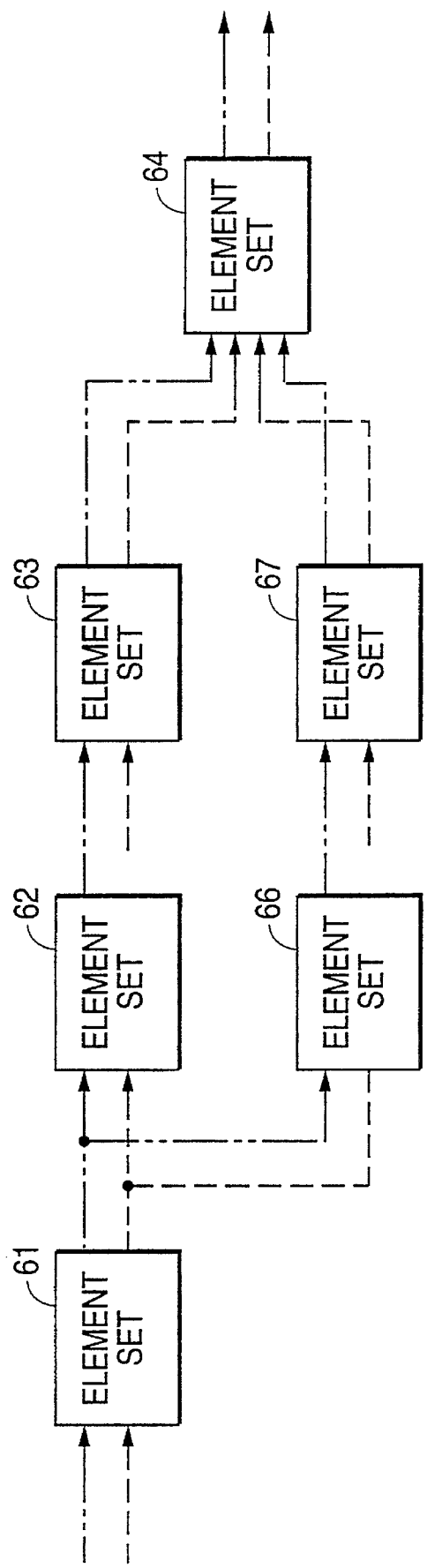
FIG. 7 shows an example of connection of each element set (2)

FIGS. 6 and 7 show embodiments of connections among element sets. FIG. 6 shows how to realize sequential processing using element sets 51, 52, and 53. Each of the element sets has the same function as partial circuit 11 shown in FIG. 3A, and the contents of its operation are determined according to sequential processing descriptions. In this example, a result of an operation performed by 51 is used by 52 and 53, and 52 performs its operation after 51 completes its operation, and then 53 performs its own operation. Thus, a sequence of operations can be realized such that it matches the sequence of sequential processing descriptions.

FIG. 7 shows a practical example of a conditional branch. In FIG. 7, element sets 61, 63, and 67 are element sets having the same function as partial circuit 11. Element sets 62 and 66 are the same as element set 29A shown in FIG. 4A, and element set 64 is the same as element set 30 shown in FIG. 5A.

Element set 61 transmits a result of its operation and an output update event to element sets 62 and 66. Since the input terminal of element set 66 is a negative logic, an output update event is transmitted from 66 to 67 if a result of an operation of 61 is "0", and an output update event is transmitted from 62 to 63 if a result of an operation of 61 is "1". Element set 64 receives an output evaluation update event from either of element sets 63 and 67 and outputs a value updated according to a corresponding input update event.

Figure 8B:
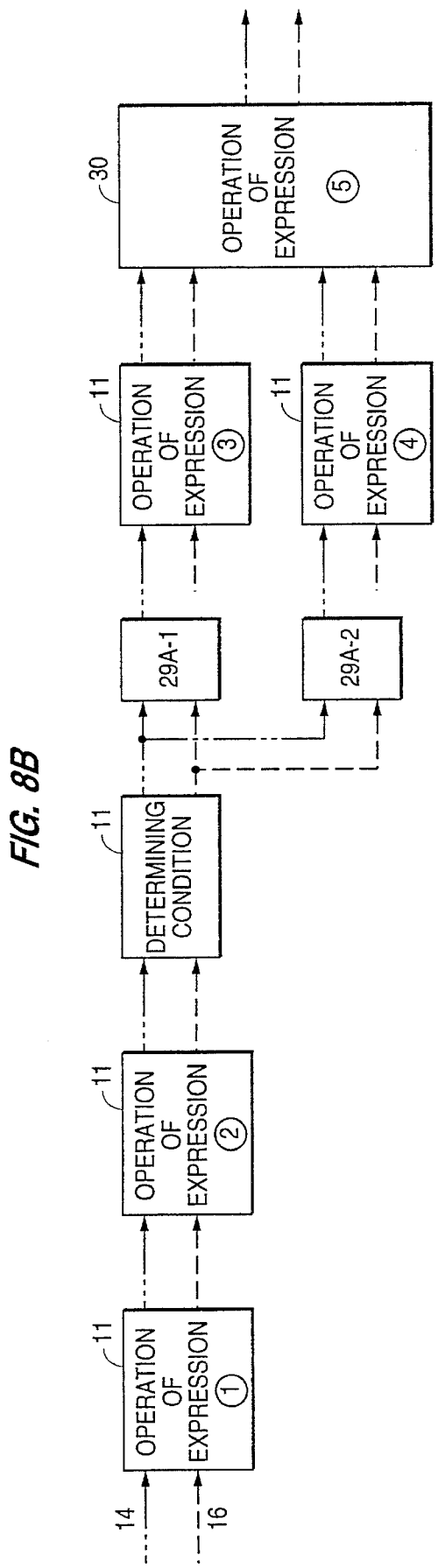
FIG. 8B shows a logic simulation method for the program shown in FIG. 8A.

FIGS. 8A and 8B show the logic simulation method according to the present invention and an example of its program. FIG. 8A shows an example of the contents of the program in which an operation of expression 1 is followed by that of expression 2 using the result of expression 1. The result of expression 2 is used for condition determination. If the condition is satisfied, expression 3 is performed. If not, expression 4 is performed. Expression 5 is performed using either of the results of expressions 3 and 4.

FIG. 8B shows the logic simulation method realized according to the above described program. In FIG. 8B, partial circuit 11 shown in FIG. 3A performs an operation of expression 1. The result of the operation is used in an operation of expression 2 performed by partial circuit 11, and the result is used by partial circuit 11 for a condition determination. If the condition is satisfied, then an output evaluation update event is outputted by 29A-1, and an operation of expression 3 is performed by partial circuit 11. If the condition is not satisfied, that is, if "0" is applied to element set 29A-2, then an output evaluation update event is outputted by the element set, and partial circuit 11 performs an operation of expression 4. Either of these results is selected by element set 30, and a final result of an operation of expression 5 is obtained.

FIGS. 9A and 9B show another example of the logic simulation method for a function level description in sequential processing format. FIG. 9A shows an example of sequential processing description, and in this sequential processing, first, "a" is obtained as a sum of "b" and "c". Second, "d" is obtained as a sum of "a" and "e". Third, it is determined whether or not "d" is larger than "f". Depending on the result of the determination, "f" is obtained as either of a sum of "g" and "h" and a difference between "g" and "h" ("h" subtracted from "g"), and the final processing in the sequence is performed and a sum "i" of "f" and "j" is obtained.

FIG. 9B shows the logic simulation method according to FIG. 9A. In FIG. 9B, block 71 provides "a" as a sum of "b" and "c", and block 72 provides "d" as a sum of "a" and "e". Then, block 73 determines whether or not "d" is larger than "f". Each operation control unit 12 corresponds to each of these blocks. In each block, a start of a corresponding operation is controlled and its end is determined.

According to a determination result of block 73, an event output from either of the two net lists 29 indicating conditional branches effectuates an operation of either of blocks 74 and 75. If "d" is larger than "f", an operation of block 74, that is, an addition of "g" and "h", is performed. If "d" is not larger than "f", an operation of block 75, that is, a subtraction of "h" from "g" is performed. Then, element set 30 outputs "f" as a value corresponding to one of a plurality of input values, and an addition of "f" and "j" is performed by block 76, thus outputting a final result "i".

If a function level description shown in FIG. 9A is given, the number of necessary logic elements is determined depending on the types of data, kinds of operations, etc., and the configuration determines the maximum number of steps of elements from input to output.

FIG. 10 is a block diagram of the configuration of the event-driven simulator according to the logic simulation method of the present invention, that is, a simulation machine. In FIG. 10, a processor 82 simulates a unit-delay gate; an event queue list storing memory 83 stores an event queue list for the processor 82; a time series input storing memory 84 stores external inputs provided for the processor 82 in time series; a time series output storing memory 85 stores external outputs from the processor 82 in time series; a time storing memory 86 stores the present simulation execution time; and a processor 87 controls the execution of simulation of a plurality of processors.

In the unit-delay gate simulating processor 82, further provided are a logic operation/output comparison/event generation unit 100 for calculating a new output value from an input value of logical elements, comparing the result with an output value before the calculation, and transmitting the new output value to the event queue list storing memory 83 when the comparison outputs non-coincidence, a fan-out list obtaining unit 101 for obtaining a list of logic elements in which are stored logic elements input is connected to an output of logic elements whose output value has changed, a logical value storing unit 102 for storing an input/output value of logic elements, and an operation type storing unit 103 for storing a type of an operation of logic elements.

In the logic simulator shown in FIG. 10, each of the logic elements forming the logic circuit to be simulated is assigned a unique identification number, based on which simulation is carried out. The simulation is performed as follows.

(1) The processor 87 obtains the present time from the time storing memory 86, and instructs the time series input storing memory 84 to send to the event queue list storing memory 83 a change in a signal externally provided at the time. In response to the instruction, the memory 84 sends to the memory 83 the identification number of a logic element indicating a change in value according to the change in the signal together with the changed value.

(2) The event queue list storing memory 83 sends the identification number and the new value to the fan-out list obtaining unit 101 and the time series output storing memory 85.

(3) The time series output storing memory 85 receives the change of value, which is sent from the event queue list storing memory 83, as a new event, and stores it in time series. The fan-out list obtaining unit 101 retrieves a connection destination (fan-out) list of logic elements using an identification number of a logic element indicated in an event transmitted from the memory 83, and sends the identification number of a connected-to logic element entered in the list, an input pin, and a new output value indicated in the event, to the logic operation/output comparison/event generation unit 100.

(4) The logic operation/output comparison/event generation unit 100 receives, using an identification number of a logic element, an input value to an input pin of a logic element stored in the logical value storing unit 102 and the type of the logic operation of a logic element stored in the operation type storing unit 103, evaluates the output value of the logic element using the obtained information, and outputs the value to the logical value storing unit 102 again. Then, it compares the new output value with the old output value stored in the logical value storing unit 102 before the evaluation. If they are different from each other, the new output value and the identification number of the logic element are sent to the event queue list storing memory 83.

(5) The event queue list storing memory 83 stores a new output value sent from the logic operation/output comparison/event generation unit 100 and an identification number of a logical element.

(6) If all events to be sent to the event queue list storing memory 83 have been completely stored at a specified time, the logic operation/output comparison/event generation unit 100, the fan-out list obtaining unit 101, and the event queue list storing memory 83 report it to the processor 87. The processor 87 instructs the time storing memory 86 to step up the time by "1". The time series output storing memory 85 obtains a new time from the memory 86, and stores the value internally. Then, the processor 87 issues the same instruction described in (1) to the time series input storing memory 84. The event queue list storing memory 83 adds an event from the time series input storing memory 84 to the event sent in (5) from the logic operation/output comparison/event generation unit 100. At an initial time of the simulation, the memory 83 stores nothing. Afterwards, the event queue list storing memory 83 stores both the identification number of the element in which a value sent from the time series input storing memory 84 has changed and the value (event), and an event sent from the logic operation/output comparison/ event generation unit 100, and sends them to the fan-out list obtaining unit 101.

(7) After sending all events, the time series input storing memory 84 reports it to the processor 87. The processor 87 instructs the event queue list storing memory 83 to send stored events to the fan-out list obtaining unit 101 and the time series output storing memory 85.

If the process is repeated a predetermined number of times, the processor 87 determines that all processes has been completed, and terminates the simulation. A "predetermined number of times" indicates how long the simulation of a logic circuit is to be performed. The number of serial elements of an operation control unit corresponding to one of the operations is not related to this predetermined number of times. The time period corresponding to the predetermined number of times is much longer than the time corresponding to the number of serial elements.

The unit-delay event-driven logic simulator shown in FIG. 10 is referred to as a "unit-delay" simulator because it evaluates outputs of all logic elements in time unit stored in the time storing memory 86, and is referred to as "event-driven" because it sends an event only to the fan-out destination of an element which indicates a change in its output value, and evaluates only an output value of a logic element which received the event. In the logic simulator, for example, an output evaluation update event internally transmitted in block 12 or 13 shown in FIG. 3A and an event 15 outputted externally from block 11 are equally processed. That is, events represented by the same type of line (a solid line, broken line, or alternate long and two short dashes line) are not distinguished from each other even if they are inside or outside a partial circuit corresponding to an operation.

The above described output evaluation update event corresponds to an event explained in step (4) by referring to FIG. 10. An event represented by a broken line, that is, an input evaluation update event, has the logic operation/output comparison/event generation unit 100 store a value of an input pin in the logical value storing unit 102 without sending a new output and an identification number to the event queue list storing memory 83. Furthermore, an event represented by an alternate long and two short dashes line, which informs only of output evaluation update, has the logic operation/output comparison/event generation unit 100 retrieve an input value to an input pin from the logical value storing unit 102, calculate a new output value using the input value and the type of the operation stored in the operation type storing unit 103, compare the value with the old output value, and send the new output and the identification number to the event queue list storing memory 83 when the comparison indicates a non-coincidence. The event itself is not provided with a new input value.

The type of event is recorded in each entry in a fan-out list obtained by the fan-out list obtaining unit 101. An inputting of an event indicates a sending of one of these three types of events. Inversion of an output of the inverter explained by referring to FIG. 3B indicates that a result of a NOT operation with a logical value set for an input pin is regarded as an output according to an event represented by an alternate long and two short dashes line in an operation corresponding to the inverter.

Furthermore, as explained in FIG. 1, at the end of a simulation for an operation control unit, a sending of an event informing of termination of an operation to an operation control unit corresponding to the next operation is equivalent to a sending of an event from the logic element at the last stage in logic element set (partial circuit) 12 to a logical element at a first stage in logic element set 12 for performing the next operation. In the logic simulation of a logic circuit, an output value of a logic element changes as a result of an output comparison by the logic operation/ output comparison/event generating unit 100 shown in FIG. 10. Then, the event is sent to the event queue list storing memory 83, and consequently, at the next time period, the fan-out list obtaining unit 101 obtains a list of connected-to logic elements of the present logic element and input pins. The logic elements evaluate outputs using input values of new input pins. Output values of logic elements are not evaluated at all unless this event is entered, thereby preventing any operation from being performed.

The operation control unit shown in FIG. 3 can be realized, for example, by serially connecting event informing logic elements in the same number of logic elements from input to output of the corresponding logic element set 1 because the time taken for evaluating an output of each logic element in logic element set 1 corresponds to the above described unit-delay, and the unit-delay time is fixed. That is, the output of the logic element at the last stage is delayed by the number of stages of the logic elements because the completion of an operation to be performed by logic element set 1 is transmitted as an event by the serial logic elements forming the operation control unit 2.

Figure 11:
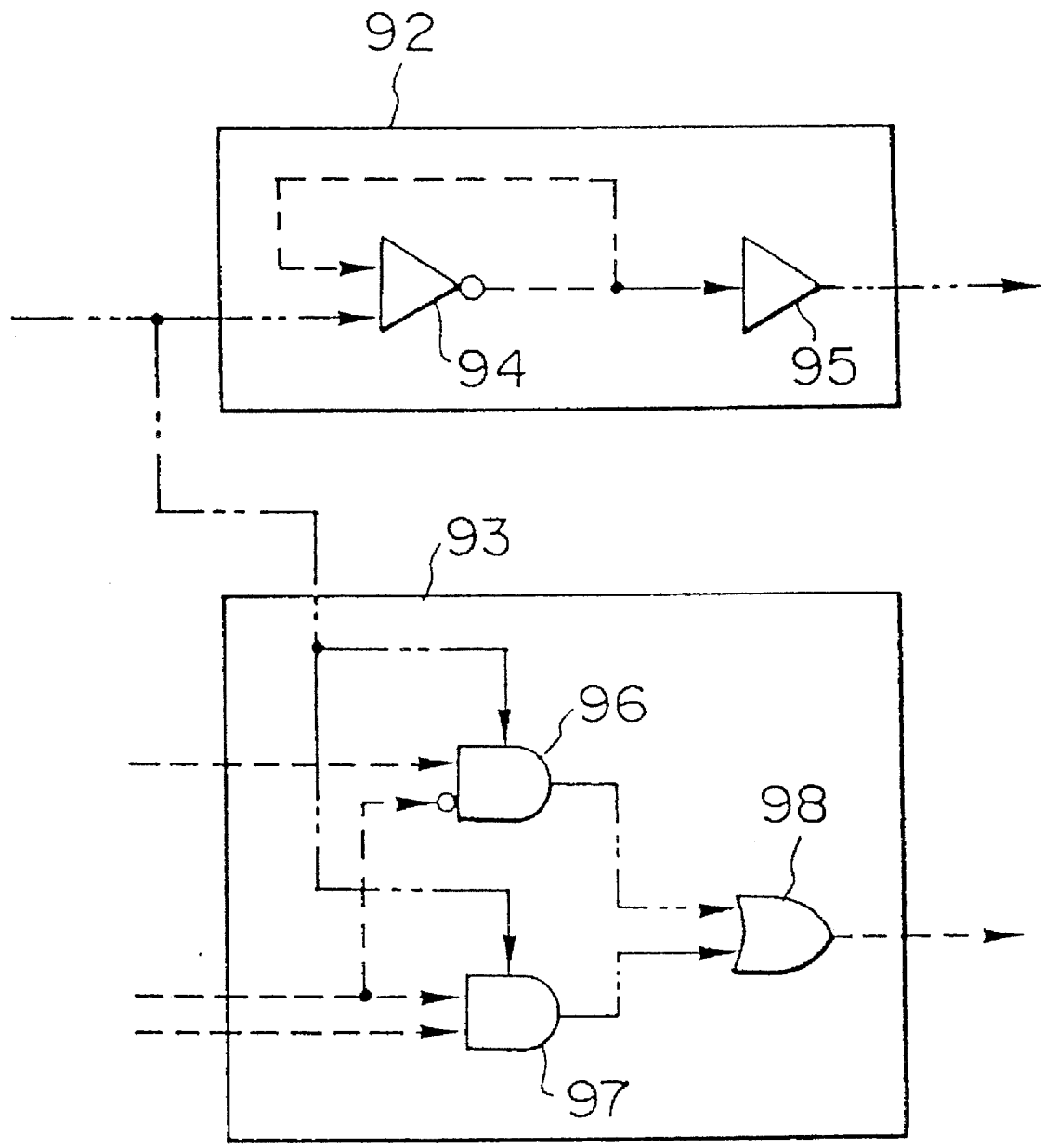
FIG. 11 shows an example of an circuit for performing a simulation using a dedicated machine shown in FIG. 10.
Figure 12A:
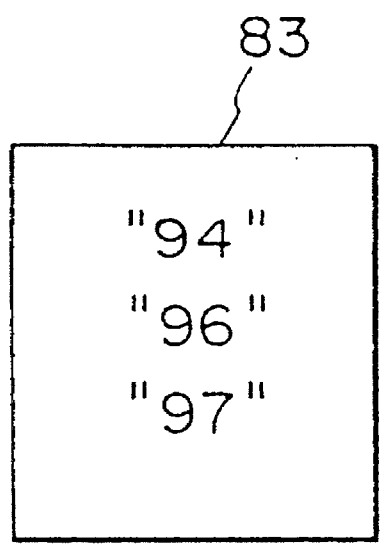
FIG. 12A shows the contents of an event queue list (first time)
Figure 12B:
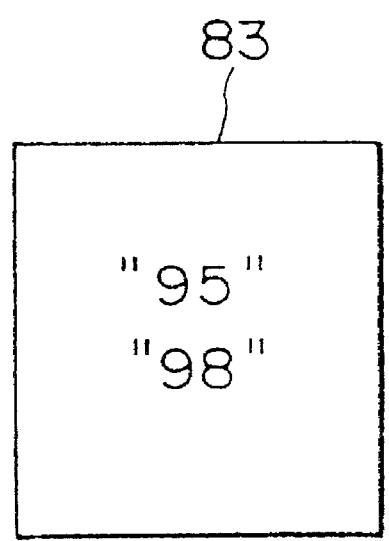
FIG. 12B shows the contents of an event queue list (next time)

FIG. 11 show an example of the partial circuit 11 of FIG. 3A. 92 is an example of element set 12. 93 is an example of element set 13 for performing an operation. FIGS. 12A and 12B show in time series, destinations of output evaluation update events stored in the event queue list storing memory 83 of the processor 82 in the example of the present logic simulation method. In FIG. 12A, at the first time period, output evaluation update events for inverter 94, two AND circuits 96 and 97 are stored in response to an output evaluation update event inputted through the input terminal 14. At the next time period, output evaluation update events for the buffer 95 and OR circuit 98 are stored as shown in FIG. 12B. However, if the outputs of the two AND circuits 96 and 97 remain unchanged, the output evaluation update event for OR circuit 98 is not stored. That is, the logical operation/output comparison/event generation unit 100 shown in FIG. 10 determines that the output value has not changed, thereby sending no output evaluation update event to the event queue list storage memory 83.

Element set 93 is a part of a logical circuit to be processed in a logic simulation. However, the partial circuit is not actually provided in a simulator, but only the simulation of its operation is performed as with element set 92.

Finally, the simulation of the operation of the end-of-operation determining element set shown in FIGS. 3B and 3C which uses an event-driven logic simulator shown in FIG. 10, that is, the operation control unit, is described below in detail. FIG. 13 shows the net list data storing method of converting the sequential processing descriptions represented by the end-of-operation determining element set into a net list to perform an operation simulation, and storing the data of the net list for the unit-delay gate simulating processor 82 shown in FIG. 10. In FIG. 10, the sequential processing descriptions 200 corresponding to the contents of FIG. 3B are converted into the net list 201, and then stored as data in the fan-out list obtaining unit 101, the logical value storing unit 102, and the operation type storing unit 103 in the processor 82 shown in FIG. 10.

FIGS. 14A through 14C show data stored, corresponding to the end-of-operation determining element set shown in FIG. 3B, in the fan-out list obtaining unit 101, the logical value storing unit 102, and the operation type storing unit 103. As shown in FIG. 14A, the fan-out list obtaining unit 101 stores, corresponding to each element number, one or more sets of a fan-out destination element number and its corresponding input pin number. If the input pin number is 0, an event indicating only output evaluation update is transmitted to the input pin. The data in parentheses indicate the outside of the object block of the present net list. In FIG. 14A, element 20, that is, an inverter, is assigned input pin 1 of element 20 and pin 1 of element 21 as fan-out destination of their outputs. As shown in FIG. 3B, input pin numbers are given to elements sequentially from top to bottom.

The data stored in the logical value storing unit 102 shown in FIG. 14B form a list of the values of input and output pins corresponding to element numbers. They represent input and output values of the state in which events are entered through the operation control unit. For example, an input value of input pin 1 of inverter 20 is "1", and the output value is "1". Generally, input values and output values of inverters are inverse to each other. In this case, they are both "1" because entering an event informing only output evaluation update alters an output value and transmits it to the succeeding buffer. Since an input of input pin 2 of the inverter 20 is an event only, the input value is not shown.

Data stored in the operation type storing unit 103 shown in FIG. 14C indicate a type of operation of an element corresponding to each element number. For example, the type of operation of inverter 20 is "NOT".

FIGS. 15A through 15C are detailed flowcharts showing the operational simulations of the end-of-operation determining element set shown in FIG. 3B. As explained by referring to FIGS. 14A through 14C, the processes are performed according to the net lists stored in the fan-out list obtaining unit 101, the logical value storing unit 102, and the operation type storing unit 103 shown in FIG. 10.

If the process starts as shown in FIG. 15A, "1" is posted in the event queue list storing memory 83 as an event for element 20 in step S10. The event informs of an output evaluation update only. Hereinafter, the event queue list storing memory 83 is referred to as an event memory for simplicity. Likewise, the logic operation/output comparison/event generation unit 100 is referred to a logic operation unit; and the time storing memory 86 to a time memory.

In step S11, an input value "1" of input pin 1 of element 20 is retrieved from the logical value storing unit 102. In step S12, the type of operation "NOT" of the element is retrieved from the operation type storing unit 103. In step S13, the output value "1" of the output pin of the element is retrieved from the logical value storing unit 102.

Then, the logic operation unit 100 evaluates and updates the output of element 20 in step S14 corresponding to the event posted in step S10, compares a new output value "0" with an old output value "1". Since they don't match, the new output value and the element number 20 are transmitted as an event to the event memory 83. In response to this in step S15, the event memory 83 informs the processor 87 for controlling the entire simulator that an event still exists. Thus, a process for a simulation time is completed.

The processor 87 instructs the time memory 86 to step up time by 1 in step S16, and instructs the event memory 83 to perform a process of next time. In response to this, the event memory 83 transmits the element number 20 and value 0 to the fan-out list obtaining unit 101 as a stored event in step S17, and the fan-out list obtaining unit 101 retrieves input pins 1 of elements 20 and 21 as a fan-out destination of element 20 in step S18. In steps S19 and S20, the logical value storing unit 102 stores "0" as an input value of the fan-out destination.

Then, in step S21, the type of operation of element 21 is retrieved from the operation type storing unit 103. In step S22, the old output value 1 of the element is retrieved from the logical value storing unit 102. In step S23, the logic operation unit 100 performs an output evaluation update of element 21, and compares the new output value 0 with the old output value 1. Since they don't match, a new output value and the element number 21 are transmitted to the event memory 83 as an event. In step S24, the event memory 83 informs the processor 87 that an event still exists. Thus, an operational simulation for one time period, that is, an operational simulation for element 21 is completed.

Likewise, the operational simulations for elements 22, 23, 24, and 25 are performed in steps S25 through S32 shown in FIG. 15B, steps S33 through S40, steps S41 through S48 shown in FIG. 15C, and steps S49 through S59 respectively. Finally, in step S59, an external "OUT" of the block is retrieved as a fan-out destination of element 25, and an event is transmitted to the fan-out destination of the end-of-operation determining element set 12, thus completing the process.

Then, the operational simulation for the end-of-operation determining element set shown in FIG. 3C is described below. FIGS. 16A through 16C show the results of storing data of the net list of the element set in the fan-out list obtaining unit, the logical value storing unit, and the operation type storing unit. FIG. 16A shows the data stored in the fan-out list obtaining unit 101. Among the fan-out destinations of element 29, "26-0" indicates a fan-out to an input pin informing only an event among the input pins of element 26.

FIG. 16B is a list of input and output values stored in the logical value storing unit 102. Among the values, for example, "6" of "6,0" for the comparator 28 indicates a constant provided for the comparator. An output value of element set 29 is inverted if an output evaluation update event is received when an input value is "1". Among the values for element sets 29, the heading four "0"s are input values for four input pins.

FIG. 16C shows the data stored in the operation type storing unit 103. The data indicate the operation for element set 29 is "1 detect" for inverting the output value when the above described event is received.

FIGS. 17A through 17J are the detailed flowcharts showing the operational simulation for the end-of-operation determining element set shown in FIG. 3C. Since the processes performed according to the flowcharts are similar to those shown in FIG. 15, only the important points are explained below.

In FIG. 17A, when the process starts, "1" is posted as an event to inverter 26 in step S61. In steps S62 through S64, the input and output values and the type of operation already stored are retrieved. In step S65, an output evaluation update is performed for inverter 26, and an event is transmitted to the event memory 83. In step S66, the processor 87 is informed that an event still exists. Thus, one operational simulation for one time period, that is, the operational simulation for inverter 26 is completed.

Then, in step S67, the time is stepped up by 1. In steps 67 through S75, one operational simulation for the counter 27 is performed. That is, fan-out destinations of inverter 26 are retrieved, the output value "0" of inverter 26 for the input pins of the fan-out destinations are stored, and input and output values for input pin 1 of counter 27 ("0" as both input and output values) are retrieved. In step S74, the logic operation unit 100 updates the output value evaluation for counter 27, "1" is obtained as a new output value, and an event is provided for the event memory 83.

Then, in steps S76 through S88 shown in FIG. 17B, the output values of counter 27 of next time and the comparator 28 are evaluated. That is, the time is stepped up by 1 in step S76, and the operations up to the output evaluation update for counter 27 are performed in steps S77 through S83.

In step S83, an event is transmitted to the event memory 83 when an output value of counter 27 changes. Then, the output values of the counter are evaluated at the same time as the output values of the comparator 28. That is, in step S84, the constant value "6" for the comparator 28 is retrieved as an input value for input 1. The type of operation is retrieved in step S85, and an output value is retrieved in step S86. In step S87, an output evaluation update is performed. However, at this time, the output value is not changed. Therefore, no event is generated, and the processor 87 is informed that an event still exists, thereby causing the process of the next time to be performed. In steps S67 through S75, as described above, an output evaluation of the comparator 28 is not performed because the present invention does not comprise an operation control unit operating for only one simulator time.

Likewise, output evaluation updates are performed on counter 27 and comparator 28 in steps S89 through S101 shown in FIG. 17C, steps S102 through S114 shown in FIG. 17D, steps S115 through S127 shown in FIG. 17E, and steps S128 through S139 shown in FIG. 17F. In steps S89 through S101, the output value of counter 27 is "3". In steps S102 through S114, the output value of counter 27 is "4". In steps S115 through S127, the output value of counter 27 is "5". Since these output values are smaller than the constant "6" assigned to the comparator 28, the output of the comparator 28 remains unchanged "0".

On the other hand, in step S195, the output evaluation update performed on counter 27 yields an output value "6". As a result, the output evaluation update performed on the comparator 28 yields a new output value "1", and the new output value is transmitted together with the element number 28 to the event memory Then, in steps S140 through S156 shown in FIG. 17G, output evaluation updates are performed for the counter 27, the comparator 28, and the element set 29. At this time, since the output of the comparator 28 is "1" in step S199 as described above, a new output value "1" is obtained in the output evaluation update of the element set 29, and the new output value and the element number 29 are transmitted to the event memory 83. At this stage, the event is only transmitted to the event memory, but not yet outputted externally of the end-of-operation determining element set 12' explained by referring to FIG. 9C. It is outputted at the next process time.

Then, at the process time of steps S158 through S179 shown in FIG. 17I, an event is transmitted in step S161 to a fan-out destination of the element set 12' shown in FIG. 3C. Next, output evaluation updates are performed for the counter 27 and the comparator 28. In the output evaluation update performed for the comparator 28 in step S170, a new output value is the same as an old output value, thus generating no events. In the next output evaluation update for the element set 29, a new output value is also "1", thereby generating no events.

The subsequent processes are a clearing of the inverter 26 and a processing of an event stored in the event memory 83. The processes are continued as long as events exist in the event memory 83.

In steps S175 through S178 in FIG. 17I, an output evaluation update is performed for the inverter 26. That is, according to an output evaluation update event transmitted from the element set 29, an output evaluation update is performed for the inverter 26 in step S178. Since the new output value "1" does not match the old output value "0", the new output value and the element number 26 are transmitted to the event memory 83.

Then, the time is stepped up by 1 in step S180, and the simulation of the next time is started. At this stage, an event stored in the event memory 83 is transmitted to the fan-out list obtaining unit 101 to perform an output evaluation update of a counter. In the output evaluation update (S186), an event is transmitted to the event memory 83. At this time, the counter 27 outputs a new value "0".

In steps S188 shown in FIG. 27J through S199, output evaluation updates are performed likewise for the counter 27 and the comparator 28.

At this time, no events are generated in the output evaluation update for the counter 27 (step S195). Also in the output evaluation update performed for the comparator 28 in step S199, no events are generated and the event memory 83 stores nothing, thereby completing the process.

As described above, the present invention realizes a high-speed logic simulation of a logic circuit designed through sequential processing descriptions using a unit-delay event-driven logic simulator, thereby shortening the time taken for logically verifying the circuit and efficiently designing the logic circuit.

What is claimed is:

1. A logic simulation method of verifying a logic circuit designed according to sequential processing descriptions, comprising the steps of:

controlling a start of a first operation described in a sequential processing description with a controlling operation corresponding to said first operation;

performing the first operation described in said sequential processing descriptions and concurrently simulating said first operation and said controlling operation corresponding to said first operation;

determining an end of said first operation by simulating said controlling operation corresponding to said first operation; and after the end of said first operation has been determined by simulating said controlling operation corresponding to said first operation, simulating a next operation described in sequential processing descriptions and concurrently simulating controlling operations corresponding to said next operation.

2. The logic simulation method according to claim 1, wherein simulating said controlling operation comprises:

simulating a plurality of serially connected logic elements equal in number to a maximum number of serial elements in a path from input to output of a logic element set required to perform an operation corresponding to said controlling operations; and determining an end of said first operation comprises determining a termination of a simulating operation of a logic element at a last stage of said serially connected logic elements.

3. The logic simulation method according to claim 2, wherein said simulating the controlling operation comprises:

storing net list data, which describe a type of a logic operation, an initial value of an input and output of each logic element, and a connection relationship between an input and an output of each of said plurality of serially connected logic elements, in a memory of a logic simulator for verifying the logic circuit;

simulating an operation of a first logic element in the plurality of serially connected logic elements using the net list data stored in said memory;

changing a value stored in the memory of the logic simulator according to an input value and an output value whose values have been changed from initial values through the simulating of the operation; and simulating the operation of a next order logic element in said plurality of logic elements, thus repeating a simulating operation of logic elements.

4. The logic simulation method according to claim 1, wherein said simulating said controlling operation comprises:

simulating operation of a counter for starting a count simultaneously with a starting of a corresponding operation;

simulating operation of a comparing means for comparing a set value, indicating a total operation time of a plurality of serially connected logic elements equal in number to a maximum number of serially-connected elements in a path from input to output of a logic element set which performs an operation corresponding to said controlling operation, with a count result of said counter; and determining the end of said operation if the count result of said counter has reached said set value.

5. The logic simulation method according to claim 4, wherein said simulating the controlling operation comprises;

storing net list data, which describe initial input and output values in said counter and said comparing means and a connection relationship between inputs and outputs of said counter and said comparing means, in a memory of a logic simulator for verifying the logic circuit;

simulating operations of said counter and comparing means using the net list data stored in said memory; and changing a value stored in the memory of the logic simulator according to an input value and an output value whose values have been changed from initial values through simulating the operation; and repeating a simulating operation of logic elements.

6. The logic simulation method according to claim 1, further comprising:

simulating a conditional branch in said sequential processing descriptions by combining an operation in the sequential processing descriptions and a controlling operation corresponding to the operation in sequential processing descriptions.

7. The logic simulation method according to claim 6, wherein said simulating said conditional branch comprises:

determining whether the first operation in the sequential processing descriptions has been completed when an input value is "1";

using a first net list to perform simulation when the input value is "1";

determining that a conditional branch operation has been completed according to a change in an output list of the logic element at a last stage of the first net list;

determining whether the first operation in the sequential processing descriptions has been completed when an input value is "0";

using a second net list to perform simulation when the input value is "0";

determining that a conditional branch operation has been completed according to a change in an output list of the logic element at a last stage of the second net list; wherein said first and second net lists are connected in parallel to an input direction to perform a circuit operation simulation; and simulating two controlling operations after the simulation of the first and second net lists according to whether said input value is 1 or 0, and any simulation of the controlling operations corresponding to a next operation to be simulated as a result of a destination of said condition and a simulation of said next operation corresponding to any of said controlling operation are carried out.

8. The logic simulation method according to claim 1, further comprising:

simulating an element set which outputs a value corresponding to one of the plurality of input values by simulating a combination of an operation in the sequential processing descriptions and a controlling operation corresponding to said operation in sequential processing descriptions; and starting the simulation of the element set corresponding to one of a plurality of input values only in response to an input of a result of an operation which is determined to be completed by the simulation of each of the controlling operations.

9. The logic simulation method according to claim 1, further comprising the steps of:

obtaining the first operation in the sequential processing descriptions and the corresponding controlling operation;

starting a simulation of said controlling operation and a simulation of the first operation;

determining whether or not a predetermined simulation time has passed for the simulation of the controlling operation;

performing the simulation of the controlling operation for one simulator time if said predetermined simulation time has not passed;

performing the simulation of the operation corresponding to said controlling operation for one simulator time if said predetermined simulation time has not passed;

determining whether or not a present operation is a last operation in the sequential processing descriptions if it is determined that the predetermined simulation time has passed;

repeating processes of and after starting the simulation of the controlling operation and the simulation of the operation corresponding to the controlling operation for an operation following the present operation if the present operation is not the last operation; and terminating the simulations if it is determined that the present operation is the last operation in the sequential processing descriptions.

10. An event-driven logic simulator for verifying a logic circuit designed corresponding to sequential processing descriptions, comprising:

first processor means for simulating a gate as a unit delay element, said unit delay being a delay time taken for evaluating an output a logic element forming part of the logic circuit;

time storing memory means for storing a present time;

time series input storing memory means for storing in time series an external input received by said first processor means;

time series output storing memory means for storing external outputs, in time series, of said first processor means; and second processor means for controlling an entire simulation.

11. The event-driven logic simulator according to claim 10, wherein said first processor means comprises:

event queue list storing memory means for storing an event queue list for said first processor means;

logic operation/output comparison/event generation means for calculating a new output value from an input value provided for the logical element, comparing said new output value with an output value before the calculation, and sending the new output value to said event queue list storing memory means if the two output values do not match each other;

fan-out list obtaining means for retrieving a list of logic elements receiving as an input an output of a logic element whose output value has changed;

logical value storing means for storing an input/output of a logic element; and operation type storing means for storing types of operations of logic elements.

* * * * *

UNITED STATES PATENT AND TRADEMARK OFFICE
CERTIFICATE OF CORRECTION

PATENT NO. : 5,475,832
DATED : December 12, 1995
INVENTOR(S) : Minoru SHOJI et al.

It is certified that error appears in the above-indentified patent and that said Letters Patent is hereby corrected as shown below:

Column 2, line 16, delete ",".

Column 4, line 5, change "sets" to --set--; and line 26, after "unit" (second occurrence) insert --2--.

Column 5, line 11, after "respectively" insert --,--; and line 13, after "described" insert --above--.

Column 15, line 50, change "S199" to --S139--; and line 57, change "9C" to --3C--.

Signed and Sealed this

Sixteenth Day of April, 1996

Attest:

BRUCE LEHMAN

*Attesting Officer*       *Commissioner of Patents and Trademarks*